United States Patent
Lee

(10) Patent No.: US 11,367,501 B2
(45) Date of Patent: Jun. 21, 2022

(54) TEST METHOD FOR MEMORY DEVICE, OPERATING METHOD OF TEST DEVICE TESTING MEMORY DEVICE, AND MEMORY DEVICE WITH SELF-TEST FUNCTION

(71) Applicant: SAMSUNG ELECTRONICS CO., LTD., Suwon-si (KR)

(72) Inventor: Jung Hyuk Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 17/035,917

(22) Filed: Sep. 29, 2020

(65) Prior Publication Data

US 2021/0265003 A1 Aug. 26, 2021

(30) Foreign Application Priority Data

Feb. 26, 2020 (KR) .......................... 10-2020-0023607

(51) Int. Cl.
| | |
|---|---|
| *G11C 29/42* | (2006.01) |
| *G11C 11/16* | (2006.01) |
| *G11C 29/44* | (2006.01) |
| *G06F 11/10* | (2006.01) |

(52) U.S. Cl.
CPC .......... *G11C 29/42* (2013.01); *G06F 11/1068* (2013.01); *G11C 11/1673* (2013.01); *G11C 11/1675* (2013.01); *G11C 29/44* (2013.01)

(58) Field of Classification Search
CPC . G11C 29/42; G11C 11/1673; G11C 11/1675; G11C 29/44; G06F 11/1068
See application file for complete search history.

(56) References Cited

U.S. PATENT DOCUMENTS

| | | | | |
|---|---|---|---|---|
| 5,862,088 | A * | 1/1999 | Takemoto | G11C 29/44 |
| | | | | 365/201 |
| 6,195,771 | B1 * | 2/2001 | Tanabe | G11C 29/44 |
| | | | | 365/201 |
| 6,343,366 | B1 * | 1/2002 | Okitaka | G11C 29/44 |
| | | | | 714/719 |
| 6,584,589 | B1 | 6/2003 | Perner et al. | |
| 8,320,167 | B2 | 11/2012 | Rao et al. | |
| 8,386,861 | B2 | 2/2013 | Chen | |
| 9,110,829 | B2 | 8/2015 | Chih et al. | |
| 9,455,014 | B1 | 9/2016 | Lee et al. | |
| 9,672,886 | B2 | 6/2017 | Wang et al. | |
| 9,711,215 | B2 | 7/2017 | Manipatruni et al. | |

(Continued)

Primary Examiner — Kyle Vallecillo
(74) Attorney, Agent, or Firm — Volentine, Whitt & Francos, PLLC

(57) ABSTRACT

A test method for a memory device including a plurality of memory cells includes generating a first test pattern, performing a first pattern write operation of writing the first test pattern in the plurality of memory cells, reading first data from the plurality of memory cells in which the first test pattern was written, generating a second test pattern based on the first data, and performing a second pattern write operation of writing the second test pattern in the plurality of memory cells. The second test pattern is generated such that a write operation is skipped with regard to failure cells from among the plurality of memory cells at which a write failure occurs, during the second pattern write operation.

20 Claims, 25 Drawing Sheets

(56) References Cited

U.S. PATENT DOCUMENTS

| | | | |
|---|---|---|---|
| 10,204,700 B1* | 2/2019 | Oh | G11C 29/56008 |
| 10,897,738 B2* | 1/2021 | Shin | H04W 52/028 |
| 2004/0122620 A1* | 6/2004 | Doi | G01R 31/31725 |
| | | | 702/182 |
| 2008/0046788 A1* | 2/2008 | Lee | G11C 29/14 |
| | | | 714/718 |
| 2016/0147599 A1 | 5/2016 | Kim | |
| 2017/0110206 A1* | 4/2017 | Ryu | G11C 29/4401 |
| 2018/0166150 A1* | 6/2018 | Lee | G11C 29/76 |
| 2019/0066813 A1* | 2/2019 | Perner | G11C 29/36 |
| 2019/0333598 A1* | 10/2019 | Sasaki | G11C 29/56004 |

* cited by examiner

FIG. 8

| Iteration | Write PT | Read Data | |
|---|---|---|---|
| 1 | [11111111] | [11110111] | → Failure for MC5 |
| 2 | [11111111] | [11111101] | → Failure for MC7 |
| 3 | [11111111] | [11110111] | → Failure for MC5 |
| 4 | [1111X111] | [11110110] | → Skip re-write for MC5 / Failure for MC8 |
| 5 | [1111X111] | [11110101] | → Skip re-write for MC5 / Failure for MC7 |
| 6 | [1111X1X1] | 11110110 | → Skip re-write for MC5, MC7 / Failure for MC8 |

FIG. 10

| Iteration | Pre-Read Data | Write PT | Post-Read Data | |
|---|---|---|---|---|
| 1 | - | 11111111 | 11110111 | → Immediately Failure for MC5 |
| 2 | 11110110 | 1111X11X | 11110110 | → Delayed Failure for MC8<br>Skip re-write for MC5, MC8 |
| 3 | 11010110 | 11X1X11X | 10010110 | → Delayed Failure for MC3<br>Skip re-write for MC3, MC5, MC8<br>Immediately Failure for MC2 |

FIG. 12

| Iteration | Pre-Read | 1st sub-pattern* | 2nd sub-pattern** | Write PT | Post-Read |
|---|---|---|---|---|---|
| 1 | - | - | - | 11111111 | 11110111 |
| 2 | 11110110 | 111X111 | 1111111X | 111X111 | 11100111 |
| 3 | 11100110 | 111XX111 | 1111111X | 111XX11X | 11100110 |
| 4 | 11000110 | 111XX11X | 11X11111 | 111XX11X | 11100110 |

\* 1st sub-pattern = previous Post-Read

\*\* 2nd sub-pattern = XNOR(previous Post-Read, current Pre-Read)

TEST METHOD FOR MEMORY DEVICE, OPERATING METHOD OF TEST DEVICE TESTING MEMORY DEVICE, AND MEMORY DEVICE WITH SELF-TEST FUNCTION

CROSS-REFERENCE TO RELATED APPLICATIONS

A claim for priority under 35 U.S.C. § 119 is made to Korean Patent Application No. 10-2020-0023607 filed on Feb. 26, 2020, in the Korean Intellectual Property Office, the entirety of which is hereby incorporated by reference.

BACKGROUND

The present disclosure relates to semiconductor memories, and more particularly to test methods for a memory device, operation methods of test devices testing a memory device, and memory devices including a self-test function.

Semiconductor memory devices may be characterized as volatile memory devices such as static random access memory (SRAM) or dynamic random access memory (DRAM) in which stored data disappear when power is turned off, or as nonvolatile memory devices such as flash memory, phase-change RAM (PRAM), magnetic RAM (MRAM), resistive RAM (RRAM), or ferroelectric RAM (FRAM) in which stored data are retained even when power is turned off.

A failure may occur in a memory device due to various factors. Failures that occur in the process of manufacturing a memory device may be detected in the process of testing the memory device, and the detected failures may be repaired. In this case, various failures of the memory device, such as for example write failures of a memory cell, may stochastically occur. For this reason, in the case where a write failure does not occur in a plurality of memory cells at the same time during the process of testing the memory device, the memory device may be determined as normal. As such, an unexpected failure may occur when the memory device is actually used.

SUMMARY

Embodiments of the inventive concepts provide a test method for a memory device, an operation method of a test device, and a memory device configured to perform a self-test.

Embodiments of the inventive concepts provide a test method for a memory device including a plurality of memory cells, the method including generating a first test pattern, performing a first pattern write operation of writing the first test pattern in the plurality of memory cells, reading first data from the plurality of memory cells in which the first test pattern was written, generating a second test pattern based on the first data, and performing a second pattern write operation of writing the second test pattern in the plurality of memory cells. The second test pattern is generated such that failure information is written in failure cells from among the plurality of memory cells where a write failure occurs.

Embodiments of the inventive concepts further provide an operation method of a test device configured to test a memory device including a plurality of memory cells, the method including generating a first test pattern and performing a first pattern write operation of writing the first test pattern in the plurality of memory cells, reading first data from the plurality of memory cells, generating a second test pattern based on the first data and performing a second pattern write operation of writing the second test pattern in the plurality of memory cells, reading second data from the plurality of memory cells, and generating a third test pattern based on the second data and performing a third pattern write operation of writing the third test pattern in the plurality of memory cells. The second test pattern is generated such that failure information is written during the second pattern write operation in at least one first failure cell from among the plurality of memory cells at which a write failure occurs during the first pattern write operation, and the third test pattern is generated such that the failure information is written during the third pattern write operation in the at least one first failure cell, and in at least one second failure cell from among the plurality of memory cells at which a write failure occurs during the second pattern write operation.

Embodiments of the inventive concepts still further provide a memory device including a self-test function, the memory device including a memory cell array that includes a plurality of memory cells, a driving circuit that performs a write operation and a read operation on the plurality of memory cells, and built-in-self-test (BIST) logic that performs a self-test under control of an external device. During the self-test the BIST logic is configured to iteratively perform a pattern write operation on the plurality of memory cells. For each iteration of the pattern write operation the BIST logic is configured to control the driving circuit to write failure information in failure cells from among the plurality of memory cells at which a write failure occurs.

Embodiments of the inventive concepts also provide a memory device including a memory cell array including a plurality of memory cells, a driving circuit configured to perform a write operation and a read operation on the plurality of memory cells, a test register configured to temporarily store data read from the plurality of memory cells during a test operation of the memory cell array, and to generate a test pattern by combining the data stored therein and a default test pattern, and a control logic circuit configured to iteratively perform a write operation on the plurality of memory cells during the test operation using the test pattern.

Embodiments of the inventive concepts still further provide a method of manufacturing a memory device including forming the memory device as part of a wafer including the memory device and at least one other memory device, the memory device including a plurality of memory cells, and testing the memory device. The testing of the memory device includes iteratively performing a pattern write operation on the plurality of memory cells, and writing failure information in failure memory cells from among the plurality of memory cells at which a write failure occurs.

BRIEF DESCRIPTION OF THE FIGURES

The above and other objects and features of the inventive concepts will become apparent in view of the following detailed description of exemplary embodiments as made with reference to the accompanying drawings.

FIG. 8 illustrates a table descriptive of an operation according to the flowchart of FIG. 7.

FIG. 10 illustrates a diagram descriptive of an operation according to the flowchart of FIG. 9.

FIG. 12 illustrates a diagram descriptive of an operation according to the flowchart of FIG. 11.

DETAILED DESCRIPTION

Hereinafter, embodiments of the inventive concepts are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
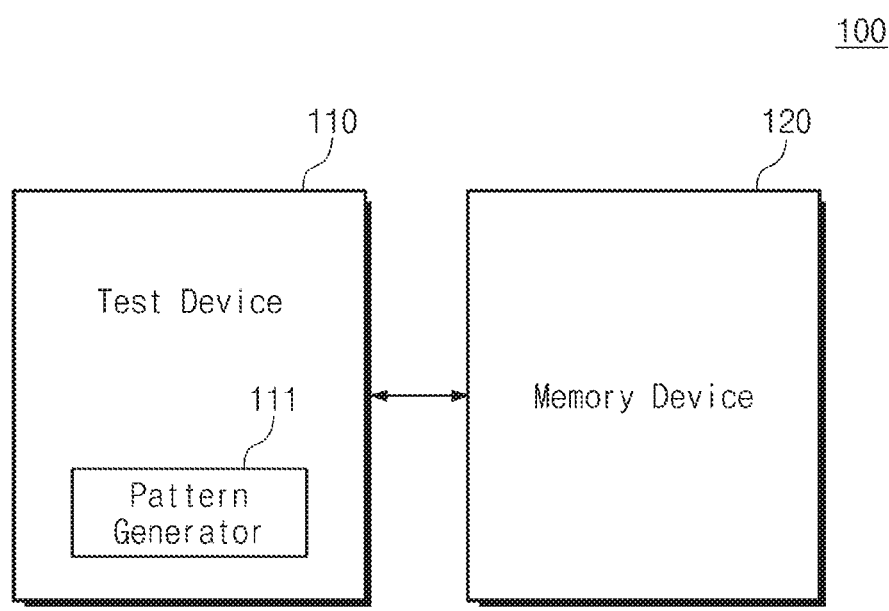
FIG. 1 illustrates a block diagram of a memory test system according to embodiments of the inventive concepts.

FIG. 1 illustrates a block diagram of a memory test system according to embodiments of the inventive concepts. Referring to FIG. 1, a memory test system 100 may include a test device 110 and a memory device 120. In an exemplary embodiment, the memory test system 100 may be used to detect a failure of the memory device 120 in the process of manufacturing the memory device 120. For example, the memory test system 100 may be used to test and detect a failure of the memory device 120 after it is manufactured and before it is implemented in a system or device.

The test device 110 may perform a test operation for detecting a failure of the memory device 120. For example, the test device 110 may perform a test operation for determining whether the memory device 120 normally performs various operations (e.g., a write operation and a read operation). In the following description of the inventive concepts, to further understanding it is assumed that the test device 110 tests a write operation of the memory device 120. However, embodiments of the inventive concepts should not be limited to write operations since operations other than write operations may be tested. Also, it is assumed that the memory device 120 is a magnetic random access memory (MRAM). However, the inventive concepts are not limited thereto. For example, the test device 110 may be configured to detect various failures occurring in the memory device 120. The memory device 120 may be implemented with various memories such as for example SRAM, DRAM, a flash memory, PRAM, MRAM, RRAM, and FRAM.

The test device 110 may be configured to control the memory device 120 for the purpose of testing the write operation of the memory device 120. For example, the test device 110 may generate a test pattern to be written in the memory device 120 and may write the generated test pattern in the memory device 120. The test device 110 may determine failure bits occurring in the memory device 120 by reading the test pattern written in the memory device 120 and comparing the read test pattern and an original test pattern. When the number of detected failure bits exceeds a reference value, the test device 110 may perform a repair operation or a screen operation on the memory device 120.

In an exemplary embodiment, the test pattern may be a bit stream necessary to determine a failure for a write operation of a plurality of memory cells included in the memory device 120. In an exemplary embodiment, the reference value may indicate the number of error bits correctable by an error correction code (ECC) engine or circuit that is included in the memory device 120 or a memory controller (not illustrated) configured to control the memory device 120.

As described above, the test device 110 may detect a failure occurring in the memory device 120 by iteratively performing an operation of writing the test pattern in the memory device 120 and checking the written test pattern.

However, a write failure may stochastically occur in each of the memory cells included in the memory device 120. That is, even though a plurality of memory cells having a high probability that a write failure occurs are present in the memory cells included in the memory device 120, the probability that a write failure occurs at the same time in a number of memory cells as much as a specific number or more may be relatively low. For example, in a test process, in the case where memory cells having a high probability that a write failure occurs are randomly detected in a plurality of write operations and not in one write operation, a write failure for the memory device 120 may not be detected. However, in an actual driving environment of the memory device 120 after the test process, even though the probability is low, a write failure may simultaneously occur in a plurality of memory cells, thereby reducing the reliability of the memory device 120. That is, the test process in which a given test pattern is simply iteratively written may provide low accuracy of detection of the write failure for the memory device 120.

The test device 110 according to embodiments of the inventive concepts may include a pattern generator 111. The pattern generator 111 may generate a test pattern to be used in a current pattern write operation based on a result of a previous pattern write operation. In this case, the pattern generator 111 may generate the test pattern based on the result of the previous pattern write operation, such that a write operation or a re-write operation for a memory cell determined as a write failure is skipped or is not performed. In this case, because locations of memory cells where a write failure occurs is written or stored in memory cells (i.e., write failure memory cells) of the memory device 120 in each of iterative pattern write operations, the accuracy of detection of the write failure for the memory device 120 may be improved. Operations of the test device 110 and the pattern generator 111 according to embodiments of the inventive concepts will hereinafter be more fully described with reference to drawings.

Figure 2:
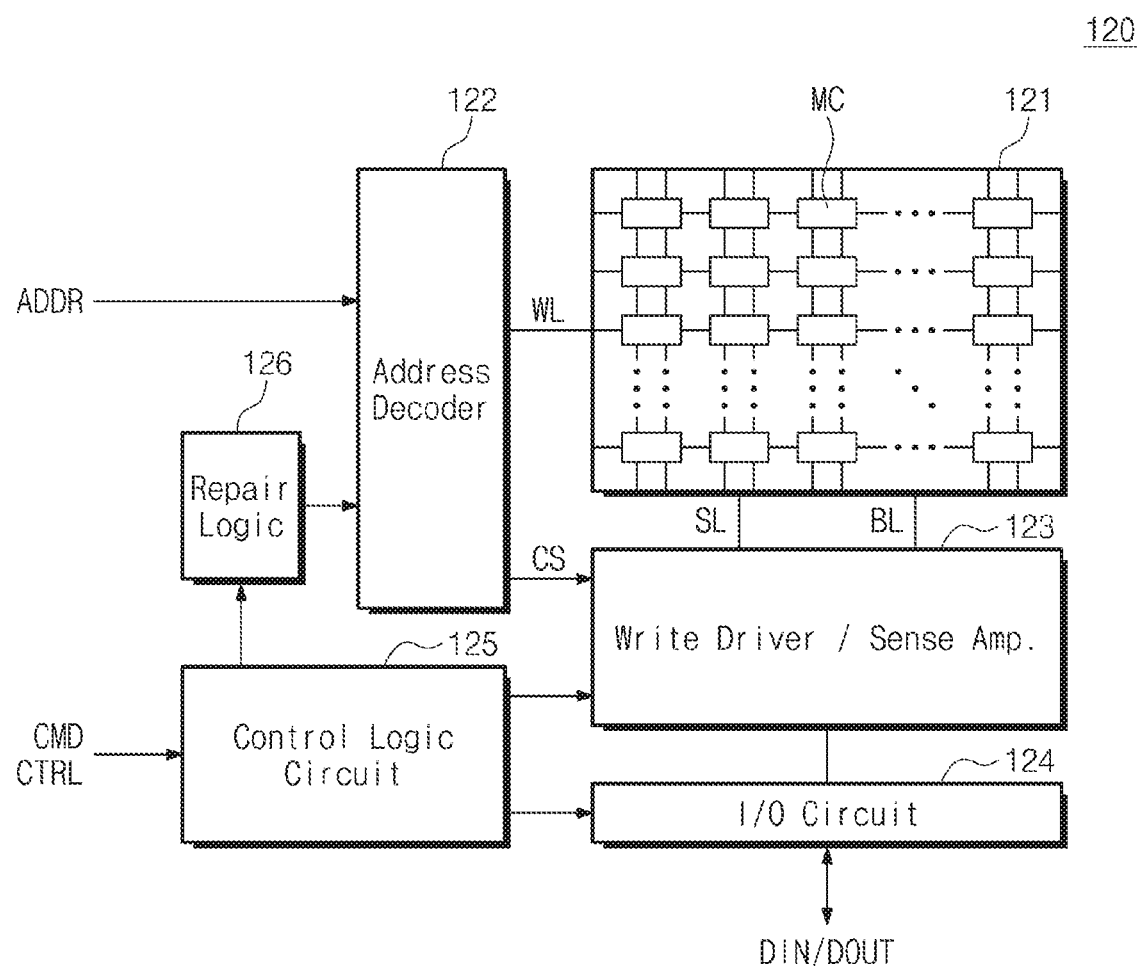
FIG. 2 illustrates a block diagram of a memory device of FIG. 1.

FIG. 2 illustrates a block diagram of a memory device of FIG. 1. Referring to FIG. 2, the memory device 120 may include a memory cell array 121, an address decoder 122, a write driver/sense amplifier 123, an input/output (I/O) circuit 124, a control logic circuit 125, and repair logic (e.g., circuitry) 126.

The memory cell array 121 may include a plurality of memory cells MC. The plurality of memory cells MC may be connected with word lines WL, bit lines BL, and source lines SL. In an exemplary embodiment, each of the plurality of memory cells MC may be an MRAM cell, but the inventive concepts are not limited thereto and the memory cells MC may be other types of cells.

The address decoder 122 may be connected with the memory cell array 121 through the word line WL. The address decoder 122 may receive an address ADDR from the test device 110 (or an external device such as a memory controller (not illustrated)) and may decode the received address ADDR. The address decoder 122 may respectively control voltages of the word lines WL based on a decoding result. The address decoder 122 may output a column selection signal CS based on the decoding result.

The write driver/sense amplifier 123 (hereinafter referred to as a "driving circuit") may be connected with the memory cell array 121 through the source lines SL and the bit lines BL. The driving circuit 123 may select the source lines SL and the bit lines BL in response to the column selection signal CS. Alternatively, the driving circuit 123 may read data stored in the plurality of memory cells MC of the memory cell array 121 by sensing voltages of the source lines SL or the bit lines BL.

The input/output circuit 124 may receive input data DIN from the test device 110 (or an external device such as a memory controller (not illustrated)) and may transfer the received input data DIN to the driving circuit 123. In an exemplary embodiment, the driving circuit 123 may write the input data DIN in the plurality of memory cells MC of the memory cell array 121 by controlling voltages of the source lines SL and the bit lines BL based on the input data DIN. The input/output circuit 124 may receive output data DOUT from the driving circuit 123 and may transfer the received output data DOUT to the test device 110 (e.g., an external device such as a memory controller).

In an exemplary embodiment, while the test device 110 performs the test operation, the input data DIN may indicate a test pattern to be written in the memory cells MC of the memory cell array 121, and the output data DOUT may indicate data read from the memory cells MC in which the test pattern is written.

The control logic circuit 125 may receive a command CMD or a control signal CTRL from the test device 110 (e.g., a memory controller) and may control an operation of the memory device 120 in response to the received signals. For example, the control logic circuit 125 may control the driving circuit 123 such that the driving circuit 123 operates as a write driver during a write operation of the memory device 120 and the driving circuit 123 operates as a sense amplifier during a read operation of the memory device 120.

The repair logic 126 may be configured to perform a repair operation on failure memory cells MC under control of the test device 110. For example, the repair logic 126 may be configured to replace a specific word line (e.g., a word line connected with failure cells) with any other word line (e.g., a spare word line) under control of the test device 110.

Figure 3A:
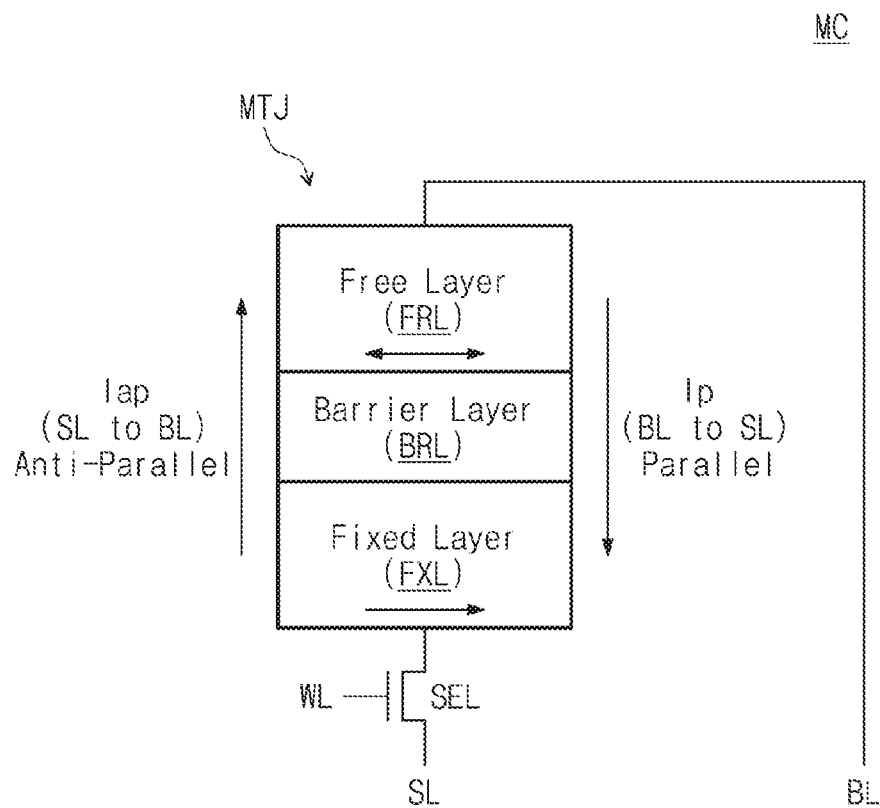
FIG. 3A illustrates a diagram of a memory cell included in a memory cell array of FIG. 2.
Figure 3B:
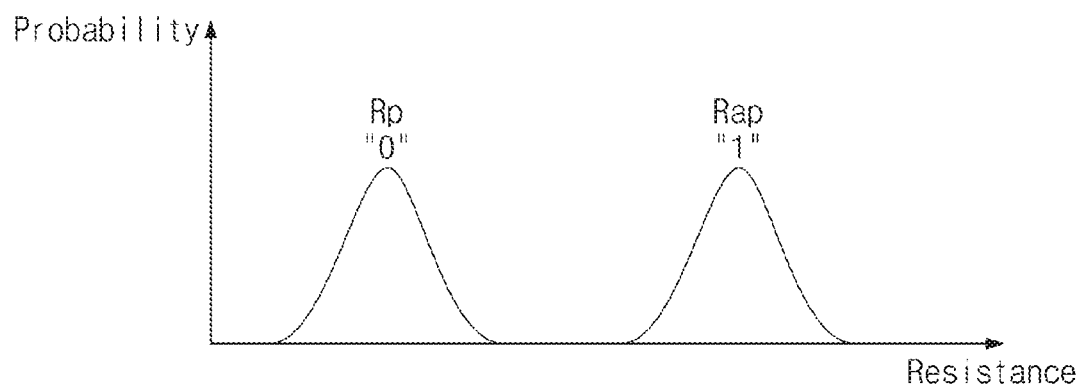
FIG. 3B illustrates a graph showing resistance values of a variable resistance element in different states.

FIGS. 3A and 3B are diagrams descriptive of a memory cell included in a memory cell array of FIG. 2. Hereinafter, to aid in description and to further understanding, embodiments of the inventive concepts will be described on the basis of a write operation of the memory device 120. An exemplary structure of one memory cell MC will be described with reference to FIG. 3A, but the inventive concepts are not limited thereto since other types of memory cells may be used. In an exemplary embodiment, in FIG. 3B a horizontal axis represents a resistance of a variable resistance element MTJ of the memory cell MC, and a vertical axis represents probability.

Referring to FIGS. 2, 3A and 3B, the memory cell MC may include a variable resistance element MTJ and a selection transistor SEL. The variable resistance element MTJ may be implemented with a magnetic tunnel junction. The variable resistance element MTJ may be connected between a bit line BL and the selection transistor SEL. The selection transistor SEL may be connected between the variable resistance element MTJ and a source line SL and may operate in response to a voltage of a word line WL.

In an exemplary embodiment, the memory device 120 may write data in the memory cell MC by adjusting a resistance value of the memory cell MC. For example, as illustrated in FIG. 3A, the variable resistance element MTJ may include a free layer FRL, a barrier layer BRL, and a fixed layer FXL. The barrier layer BRL may be interposed between the free layer FRL and the fixed layer FXL, the free layer FRL may be connected with the bit line BL, and the fixed layer FXL may be connected with the selection transistor SEL. A magnetization direction of the fixed layer FXL may be fixed to a specific direction, and a magnetization direction of the free layer FRL may be changed according to a specific condition (e.g., a direction of a write current). In an exemplary embodiment, the variable resistance element MTJ may further include an anti-ferromagnetic layer for fixing the magnetization direction of the fixed layer FXL.

In an exemplary embodiment, the free layer FRL may include a material that has a variable magnetization direction. The magnetization direction of the free layer FRL may be changed by an electrical or magnetic factor provided from the outside or the inside of the memory cell MC. The free layer FRL may include a ferromagnetic material that contains at least one of cobalt (Co), iron (Fe), and nickel (Ni). For example, the free layer FRL may include at least one selected from a group of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. However, the inventive concepts are not limited to the above noted ferromagnetic material and other appropriate ferromagnetic materials may be used.

In an exemplary embodiment, the barrier layer BRL may have a thickness that is smaller than a spin diffusion distance. The barrier layer BRL may include a non-magnetic material. For example, the barrier layer BRL may include at least one selected from a group of magnesium (Mg), titanium (Ti), aluminum (Al), oxide of magnesium-zinc (Mg—Zn), and nitride of titanium (Ti) and vanadium (V). However, the inventive concepts are not limited thereto, and other appropriate non-magnetic materials may be used.

In an exemplary embodiment, the fixed layer FXL may have a magnetization direction fixed by the anti-ferromagnetic layer. The fixed layer FXL may include a ferromagnetic material. For example, the fixed layer FXL may include at least one selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In an exemplary embodiment, the anti-ferromagnetic layer may include an anti-ferromagnetic material. For example, the anti-ferromagnetic layer may include at least one selected from a group of PtMn, IrMn, MnO, MnS, MnTe, $MnF_2$, $FeCl_2$, FeO, $CoCl_2$, CoO, $NiCl_2$, NiO, and Cr. However, the inventive concepts are not limited thereto, and other appropriate anti-ferromagnetic materials may be used. The structure, materials, or components of the variable resistance element MTJ described above are exemplary, and the inventive concepts are not limited thereto.

As illustrated in FIG. 3A, the magnetization direction of the free layer FRL may be changed according to a direction of a current Iap or Ip flowing through the variable resistance element MTJ. The current Iap or Ip may be generated by controlling voltages of the bit line BL and the source line SL when the selection transistor SEL is turned on by a voltage of the word line WL.

The anti-parallel current Iap illustrated in FIG. 3A may flow toward the bit line BL from the source line SL. When the anti-parallel current Iap flows through the variable resistance element MTJ, the magnetization direction of the free layer FRL may be opposite to the magnetization direction of the fixed layer FXL, which is called an "anti-parallel state". In contrast, the parallel current Ip illustrated in FIG. 3A may flow from the bit line BL to the source line SL. When the parallel current Ip flows through the variable resistance element MTJ, the magnetization direction of the free layer FRL may be identical to the magnetization direction of the fixed layer FXL, which is called a "parallel state".

As illustrated in FIG. 3B, in the case where the variable resistance element MTJ is in the anti-parallel state, the variable resistance element MTJ may have an anti-parallel resistance value Rap. In the case where the variable resistance element MTJ is in the parallel state, the variable resistance element MTJ may have a parallel resistance value Rp. That is, data may be stored in the memory cell MC depending on a resistance value of the variable resistance element MTJ, and the data (e.g., bit "1" or bit "0") stored in the memory cell MC may be read by reading the resistance value of the variable resistance element MTJ.

In an exemplary embodiment, data may not be normally written in the memory cell MC due to the PVT (process, voltage and temperature) variation of the memory cell MC, the variable resistance element MTJ, or any other structures or due to various factors. For example, when bit "1" is written in the memory cell MC, a control may be made such that the anti-parallel current Iap flows through the variable resistance element MTJ of the memory cell MC. However, due to various factors of the memory cell MC, an anti-parallel current Iap of a sufficient magnitude may not flow through the variable resistance element MTJ. On the other hand, even though an anti-parallel current Iap of a sufficient magnitude flows through the variable resistance element MTJ, the resistance of the variable resistance element MTJ may not be set to an anti-parallel resistance Rap. In these cases, data read from the memory cell MC may be bit "0". Likewise, when bit "0" is written in the memory cell MC, the variable resistance element MTJ may fail to have a parallel resistance Rp due to various factors of the memory cell MC. That is, a write failure for the memory cell MC may stochastically occur.

The test device 110 of FIG. 1 may iteratively perform an operation of detecting failure cells of the memory cells MC by iteratively performing an operation of writing and checking a test pattern for the memory cells MC, and may perform a repair operation or a screen operation depending on the number of detected failure cells. Hereinafter, operation of the test device 110 will be more fully described.

Figure 4:
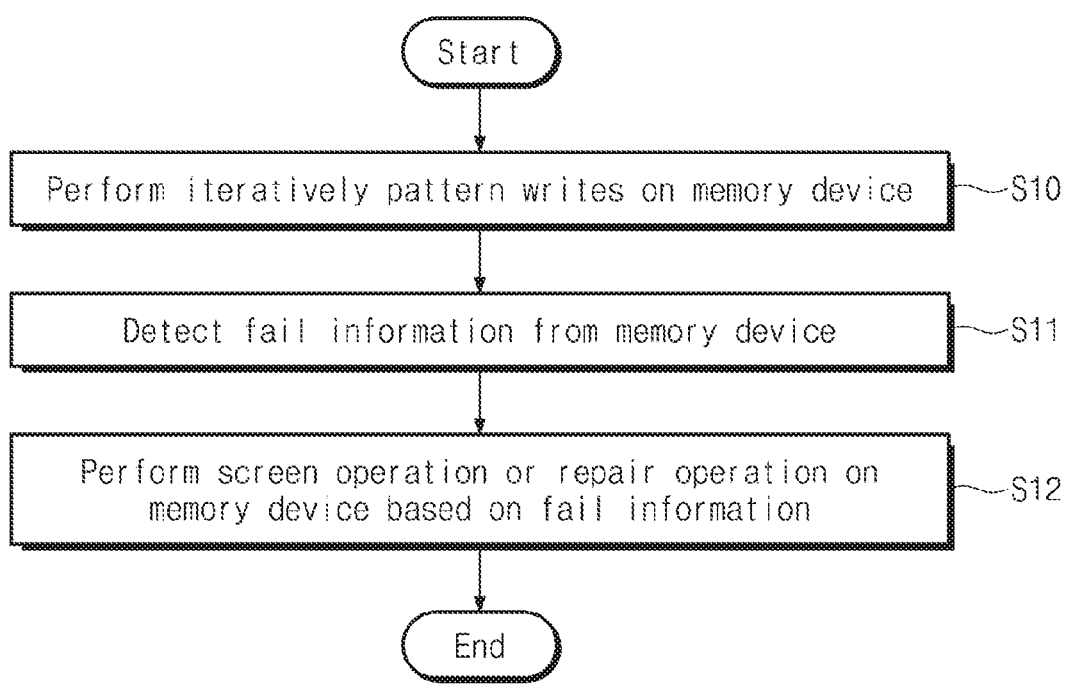
FIG. 4 illustrates a flowchart of an operation of a test device of FIG. 1.

FIG. 4 illustrates a flowchart of an operation of a test device of FIG. 1. Referring to FIGS. 1 and 4, in operation S10, the test device 110 iteratively performs a pattern write operation on the memory device 120. For example, the test device 110 may perform the pattern write operation for the purpose of detecting a write failure of the memory device 120. In an exemplary embodiment, the test pattern that is used in a current pattern write operation may be generated based on a result of a previous pattern write operation. That is, the test pattern that is used in the current pattern write operation may be generated based on the result of the previous pattern write operation such that a write operation or a re-write operation for failure cells is skipped. Operation S10 will be more fully described hereinafter with reference to the drawings.

In operation S11, the test device 110 detects failure information from the memory device 120. For example, while the pattern write operation is iteratively performed in operation S10, as a re-write operation for specific memory cells determined at least once as a failure cell is skipped, information (i.e., failure information) indicating that the specific memory cell are failure cells may be maintained at the specific memory cells themselves. In other words, in a test operation of determining whether bit "1" is normally written in the memory cells MC, in the case where the pattern write operation is iteratively performed in operation S10, data read from specific memory cells where bit "1" is not normally written in at least one of the iterative operations may be bit "0". That is, information (i.e., failure information) indicating that specific memory cells are failure cells may be detected from the memory cells MC themselves. In this case, a separate ECC operation or a separate storage space for storing failure cell information may not be required.

In operation S12, the test device 110 performs a repair operation or a screen operation on the memory device 120 based on the failure information. For example, in the case where the number of failure cells determined for each specific unit (e.g., an ECC block unit or a data word unit) based on the failure information from the memory device 120 exceeds a reference value, the test device 110 may perform the repair operation or the screen operation on the memory device 120. The manner in which the repair operation or the screen operation may be performed on the memory device 120 will be more fully described with reference to FIGS. 19 to 20.

Figure 5:
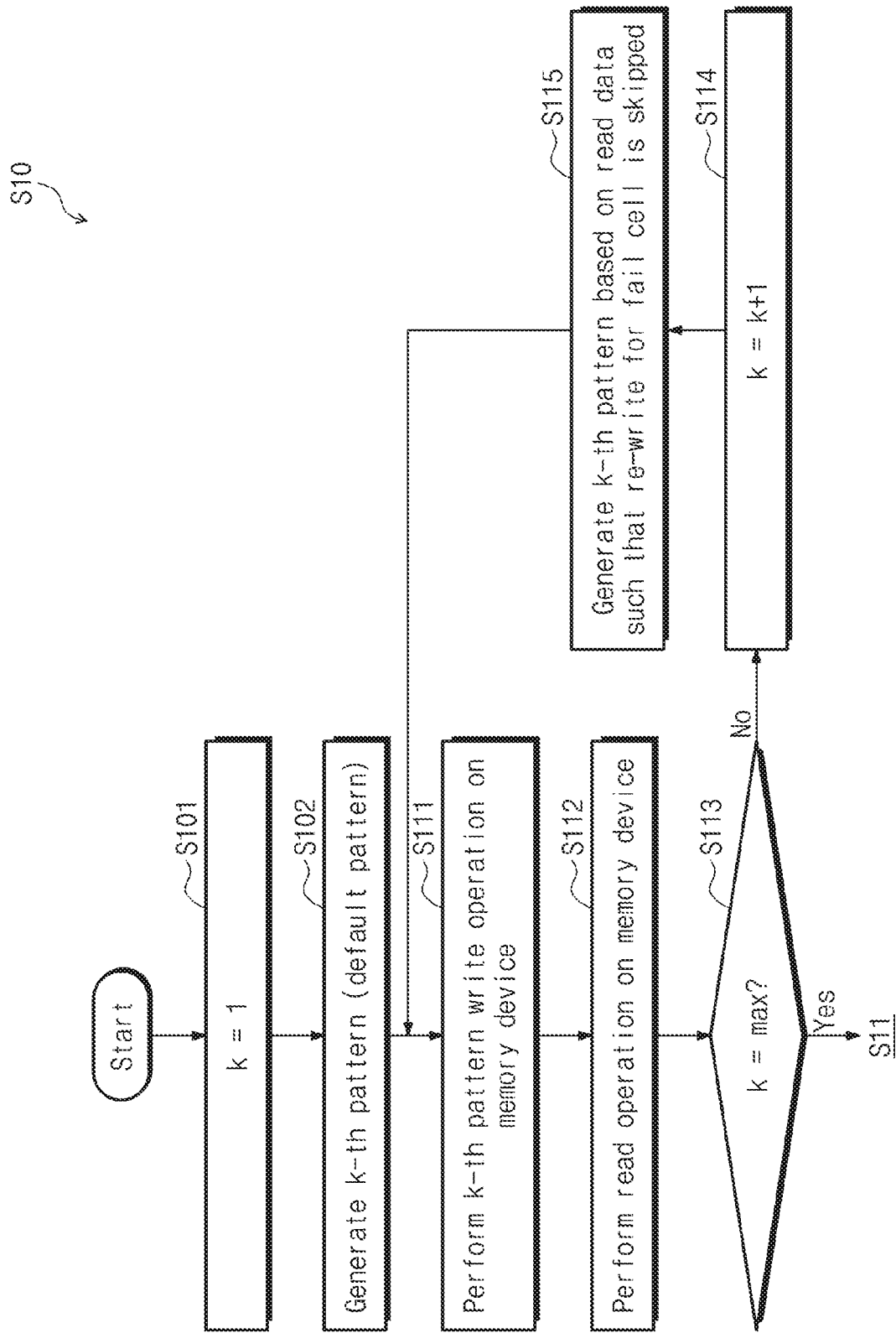
FIG. 5 illustrates a flowchart of iterative pattern write operations corresponding to operation S10 of FIG. 4.
Figure 6:
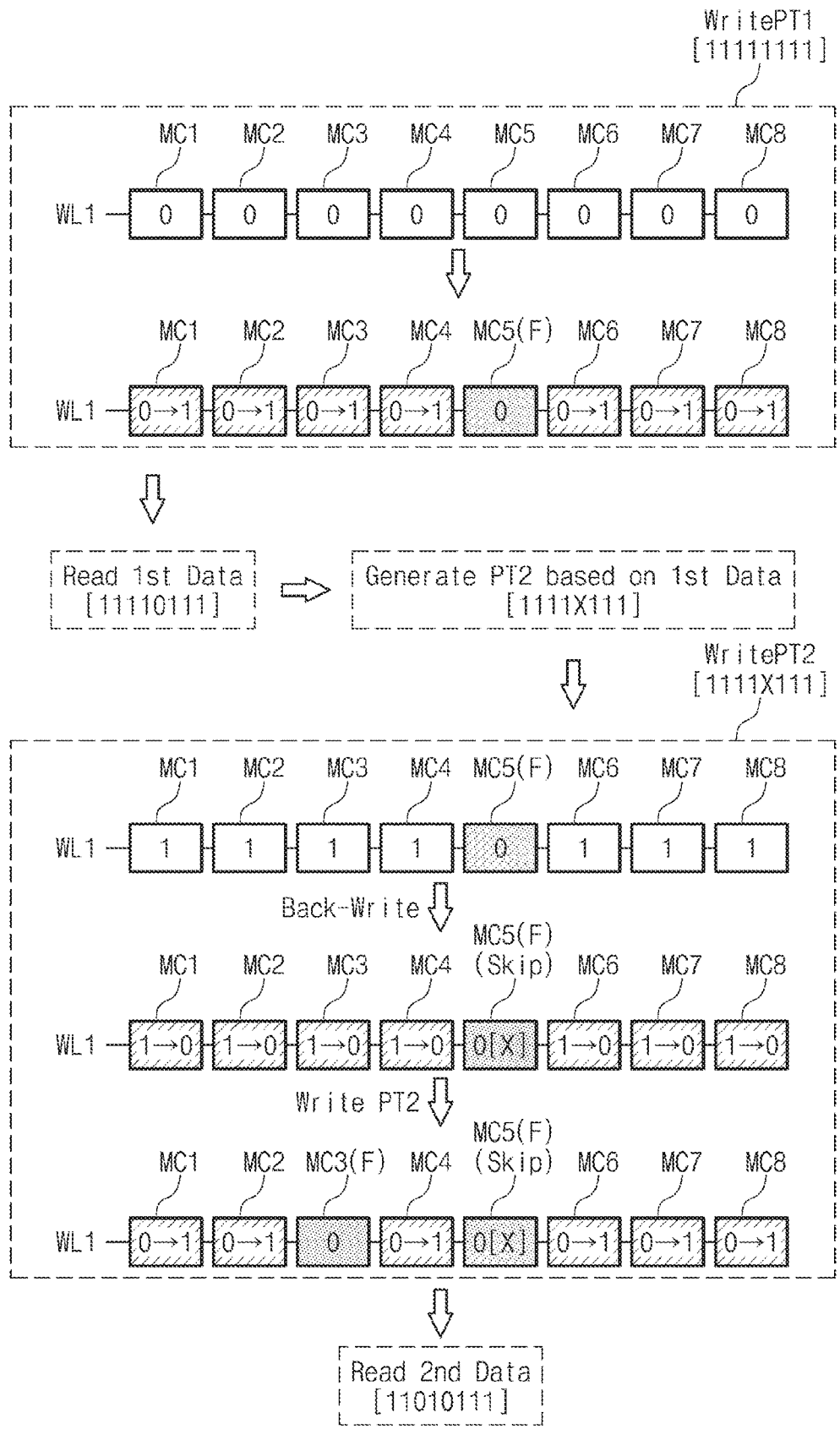
FIG. 6 illustrates a diagram descriptive of an operation according to the flowchart of FIG. 5.

FIG. 5 illustrates a flowchart of iterative pattern write operations corresponding to operation S10 of FIG. 4. FIG. 6 illustrates a diagram descriptive of an operation according to the flowchart of FIG. 5. For convenience of description, it is assumed that a pattern write operation is performed on eight memory cells MC1 to MC8 connected with a specific word line (e.g., a first word line WL1) of the memory device 120. However, the inventive concepts are not limited thereto. For example, one pattern write operation may be performed in units of a plurality of memory cells or a plurality of word lines.

Hereinafter, so as to provide clear description of embodiments of the inventive concepts, it is assumed that the test device 110 tests whether the variable resistance element MTJ of each memory cell MC normally switches from the parallel state to the anti-parallel state (i.e., whether bit "1" is normally written in each memory cell MC). That is, an initial test pattern (e.g., a default pattern) that is generated by the test device 110 may be a bit stream composed of bit "1". After the test pattern is written in the memory cells MC, in the case where bit "0" is read from a specific memory cell(s) of the memory cells MC, the specific memory cell(s) may be a failure cell(s). However, the inventive concepts are not limited thereto. For example, the initial test pattern may be implemented in various forms (e.g., a bit stream composed of bit "0" or a random pattern) depending on a test type or scheme. In an exemplary embodiment, a size or a length of the test pattern may be determined in advance (or may be set to a fixed size or length). The given size or length may be a unit (e.g., a data word or an ECC block) of an error correction operation that is performed by an error correction code (ECC) engine. Alternatively, the given size or length may be a word line unit.

Hereinafter, for convenience of description, the terms "test pattern", "pattern", and "data" are interchangeably used. The terms may have the same meaning or different meanings depending on the context of embodiments, and a meaning of each term may be understood depending on the context of embodiments to be described.

Hereinafter, so as to provide clear description of the inventive concepts, embodiments will be described wherein a write operation or a re-write operation for failure cells is skipped. However, the inventive concepts are not limited thereto. For example, that a re-write operation for a specific memory cell is skipped may mean to skip an operation of writing an intended test pattern. Alternatively, that a re-write operation for a specific memory cell is skipped may mean to skip an operation of writing failure information in the specific memory cell intentionally. For example, in the case where data read through the test operation associated with a test pattern of [11111111] is [11110111], a next test pattern may be set to [1111X111] (or [11110111]). In this case, memory cells corresponding to a bit value of "1" may store information for testing whether bit "1" is normally written, and memory cells corresponding to a bit value of "0" or a bit value of "X" may be configured to store failure information generated thereby. That is, as described above, that a re-write operation for a specific memory cell (i.e., a failure cell) is skipped may mean to intentionally write failure information occurring at the specific memory cell in the specific memory cell itself.

As described above, to maintain failure information at a specific memory cell (i.e., a failure cell), a test pattern may be generated such that a re-write operation for the specific memory cell is skipped or failure information is intentionally written in the specific memory cell. That is, reference sign "X" described in the following embodiment or drawing may indicate failure information about a corresponding memory cell, and a bit value (i.e., failure information) corresponding to reference sign "X" may be written in memory cells corresponding to reference sign "X".

Referring to FIGS. 1, 4, 5, and 6, in operation S101, a variable "k" is set to "1". In an exemplary embodiment, the variable "k" may be for describing or indicating an iteration of a pattern write operation, and it may be understood that the inventive concepts are not limited thereto.

In operation S102, the test device 110 generates a k-th pattern. For example, because the variable "k" is "1", in operation S102, the pattern generator 111 of the test device 110 may generate a first pattern (i.e., a default pattern). In this case, as described above, because the test device 110 tests whether the memory cells MC1 to MC8 of the memory device 120 normally store bit "1", the first pattern, that is, the default pattern may have a value of [11111111].

In operation S111, the test device 110 performs a k-th pattern write operation on the memory device 120. For example, the test device 110 may write the first pattern thus generated, that is, the default pattern of [11111111] in the memory cells MC1 to MC8 of the memory device 120. In an exemplary embodiment, that the test device 110 writes a pattern in the memory cells MC1 to MC8 may include transmitting, at the test device 110, the pattern and a write command to the memory device 120; and writing, at the memory device 120, the pattern in the memory cells MC1 to MC8 in response to the write command.

In detail, as illustrated in FIG. 6, the test device 110 may write a first pattern PT1 of [11111111] in the memory cells MC1 to MC8 connected with the first word line WL1 of the memory device 120. In this case, the memory cells MC1 to MC8 may store the first pattern PT1 of [11111111] through the write operation (e.g., providing the anti-parallel current Iap to each of the memory cells MC1 to MC8) described with reference to FIGS. 2 to 3B. After the first pattern PT1 is written in the memory cells MC1 to MC8, the variable resistance element MTJ of the fifth memory cell MC5 may be in the parallel state, and the remaining memory cells MC1 to MC4 and MC6 to MC8 may be in the anti-parallel state. That is, a write failure "F" may occur at the fifth memory cell MC5, and the remaining memory cells MC1 to MC4 and MC6 to MC8 may normally store bit "1".

Afterwards, in operation S112, the test device 110 performs a read operation on the memory device 120. For example, the test device 110 may read data written in the memory cells MC1 to MC8 where the first pattern PT1 is written. In detail, as illustrated in FIG. 6, the first pattern PT1 of [11111111] may be written in the memory cells MC1 to MC8, and then, data may be read from the memory cells MC1 to MC8. In this case, because a write failure occurs at the fifth memory cell MC5, the read data may be [11110111].

Afterwards, in operation S113, whether the variable "k" is equal to a maximum value is determined. When the variable "k" is not equal to the maximum value (No in operation S113), thereafter in operation S114 the variable "k" increases as much as "1". Afterwards, in operation S115 the test device 110 generates the k-th pattern based on the read data. In this case, the k-th pattern may be generated such that a re-write operation for a failure cell is not performed or is skipped. For example, as illustrated in FIG. 6, the pattern generator 111 of the test device 110 may generate a second pattern PT2 based on the read data (e.g., [11110111]). Here, the second pattern PT2 may be [1111X111]. In an exemplary embodiment, reference sign "X" is for emphasizing that a re-write operation for a corresponding memory cell is skipped, and the inventive concept is not limited thereto. In the embodiment of FIG. 6, reference sign "X" may be replaced with bit "0". That is, because a write failure occurs at the fifth memory cell MC5 in a previous pattern write operation (i.e., because the fifth memory cell MC5 is a failure cell), the second pattern PT2 of [1111X111] may be generated such that a re-write operation for the fifth memory cell MC5 is not performed or is skipped.

Afterwards, the test device 110 performs operation S111. For example, as illustrated in FIG. 6, the test device 110 may write the second pattern PT2 in the memory cells MC1 to MC8 connected with the first word line WL1. In this case, because the memory cells MC1 to MC8 are in a state of storing a value of [11110111] and whether bit "1" is normally written is being currently tested, a back-write operation may be first performed on the memory cells MC1 to MC8 such that the memory cells MC1 to MC8 store bit "0", and then, the second pattern PT2 of [1111X111] may be written in the memory cells MC1 to MC8. In an exemplary embodiment, the back-write operation may indicate an operation of writing an inversion pattern (e.g., an inversion pattern is [00000000] when a default pattern is [11111111]) corresponding to an inverted version of a default pattern in the memory cells MC1 to MC8. In this case, because a bit value of the second pattern PT2, which corresponds to the fifth memory cell MC5, is "X", the back-write operation, the write operation, or the re-write operation for the fifth memory cell MC5 may be skipped. That is, in the case where the second pattern PT2 is written in the memory cells MC1 to MC8, the write operation or the re-write operation for a memory cell (e.g., the fifth memory cell MC5) determined as a failure cell in a previous pattern write operation may be skipped. In this case, the fifth memory cell MC5 may maintain the parallel state (i.e., a state corresponding to bit "0"). In other words, the fifth memory cell MC5 itself may be in a state of storing failure information indicating a failure cell.

In an exemplary embodiment, in an operation where the second pattern PT2 is written, it may happen that the write failure "F" for example occurs at the third memory cell MC3. In this case, as described above, the third memory cell MC3 may maintain the parallel state (i.e., a state corresponding to bit "0"). As a result, after the second pattern PT2 is completely written, data read from the memory cells MC1 to MC8 may be [11010111]. Although not illustrated in drawing, a third pattern to be used in a next pattern write operation may be [11X1X111]. In the case where the third pattern is written in the memory cells MC1 to MC8, the write operation for the third and fifth memory cells MC3 and MC5 determined as a failure cell in the previous pattern write operations may be skipped.

When the determination result of operation S113 indicates that the variable "k" is equal to the maximum value (i.e., in the case where the pattern write operation is completely iterated as much as the given number of times), the test device 110 may perform operation S11 and possibly operation S12 (refer to FIG. 4).

That is, in the case where the above pattern write operation is completely iterated, a bit value read from a memory cell determined as a failure cell at least once may be bit "0". In this case, the test device 110 may compare the number of 0s (i.e., the number of failure cells) with the reference value for each given unit (e.g., an ECC block unit or a data word unit) and may perform the repair operation or the screen operation on the memory device 120 when the number of 0s (i.e., the number of failure cells) exceeds the reference value.

As described above, the test device 110 may generate a test pattern to be used in a current pattern write operation based on a result of a previous pattern write operation. In this case, the test pattern may be generated such that the write operation or the re-write operation for memory cells determined as failure cells at least once in previous pattern write operations is not performed or is skipped. In this case, in iterative pattern write operations, the memory cells determined as a failure cell at least once may maintain a failure state or may be in a state of storing failure information. Accordingly, because memory cells having the high probability that a write failure occurs are detected in a specific unit through the iteration of the pattern write operations described above, the reliability of the test operation of detecting a write failure of the memory device 120 may be improved.

Figure 7:
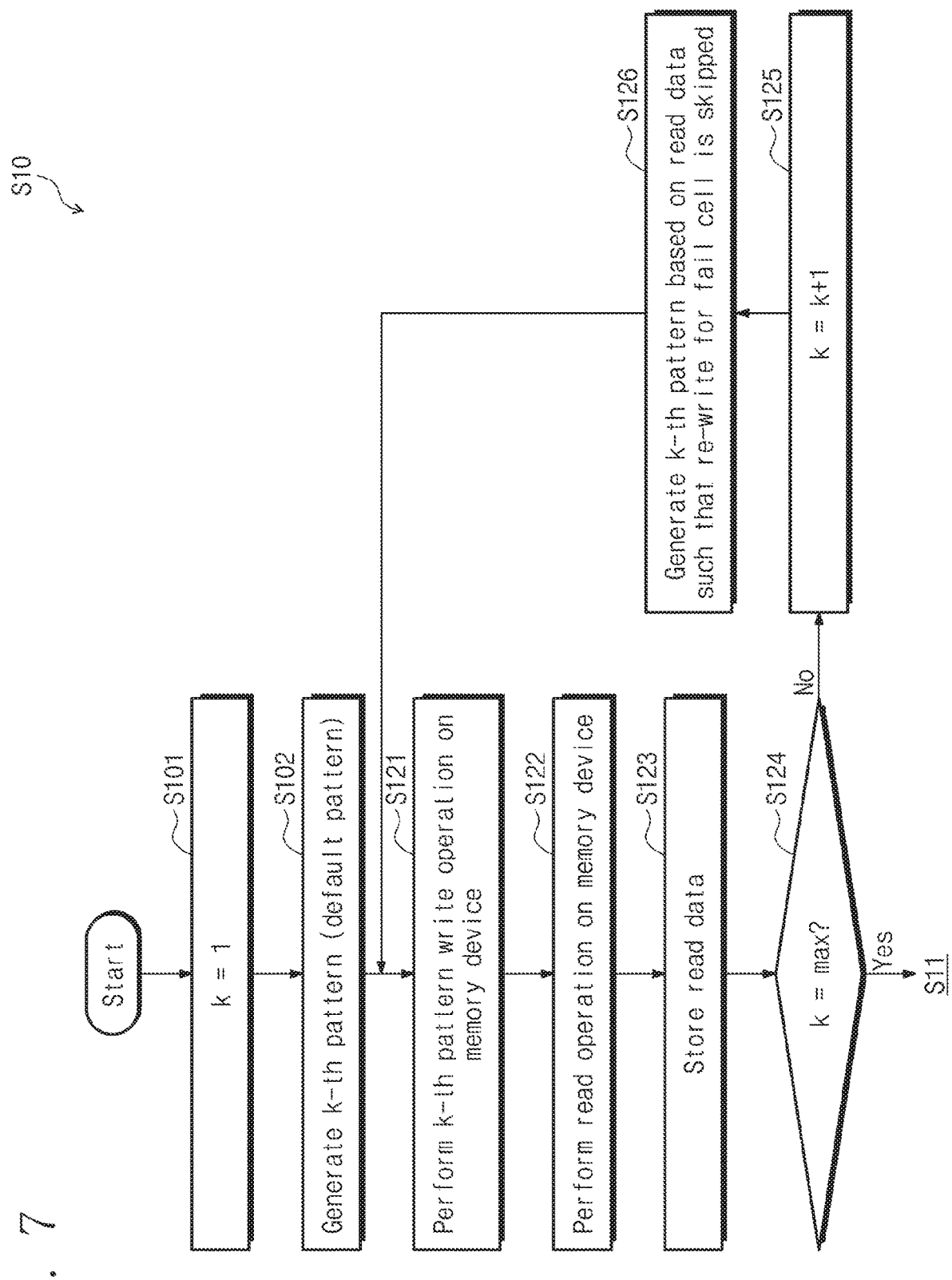
FIG. 7 illustrates a flowchart of iterative pattern write operations corresponding to operation S10 of FIG. 4.

FIG. 7 illustrates a flowchart of iterative pattern write operations corresponding to operation S10 of FIG. 4. FIG. 8 illustrates a table descriptive of an operation according to the flowchart of FIG. 7. Below, for ease of illustration and for descriptive convenience, embodiments of the inventive concepts will be described on a basis of a pattern PT used in a test process of the test device 110 and data read from the memory device 120. However, the inventive concepts are not limited thereto. As in the description given with reference to FIG. 6, it may be understood that the pattern PT is generated by the test device 110 and the test device 110 writes the generated pattern PT in the memory device 120 and reads data from the memory device 120.

Referring to FIGS. 1, 4, 7, and 8, the test device 110 performs operation S101, operation S102, operation S121, and operation S122. Operation S101 and operation S102 are described with reference to FIG. 5, and operation S121 and operation S122 are respectively similar to operation S111 and operation S112 of FIG. 5. Thus, additional description will be omitted to avoid redundancy.

In operation S123, the test device 110 stores the data read through operation S122. Afterwards, the test device 110 performs operation S124 and operation S125, and operation S124 and operation S125 are respectively similar to operation S113 and operation S114 of FIG. 5. Thus, additional description will be omitted to avoid redundancy.

In operation S126, the test device 110 generates the k-th pattern based on the stored data. In this case, the k-th pattern may be generated such that a re-write operation for specific failure cells is skipped. Afterwards, the test device 110 performs operation S121. That is, the test device 110 may iteratively perform the pattern write operation as much as the given number of times.

In an exemplary embodiment, the specific failure cells may indicate memory cells determined as failure cells as much as the given number of times while the pattern write operation is iteratively performed. For example, as illustrated in FIG. 8, in a first pattern write operation, the test device 110 may generate [11111111] as the first pattern (i.e., the default pattern) and may write the first pattern being [11111111] in the memory cells MC1 to MC8. Afterwards, the test device 110 may read data from the memory cells MC1 to MC8. In this case, the read data may be [11110111]. That the read data are [11110111] may mean that a write failure occurs at the fifth memory cell MC5 of the memory cells MC1 to MC8. The data of [11110111] read as a result of the first pattern write operation may be stored in a separate storage circuit by the test device 110. For example, in some embodiments the test device 110 stores the data read as a result of the first pattern write operation in a separate storage circuit in the test device 110.

Afterwards, in a second pattern write operation, the test device 110 may generate [11111111] as a second pattern, based on the stored data (i.e., [11110111]). The second pattern of [11111111] thus generated may be written in the memory cells MC1 to MC8. Afterwards, the test device 110 may read data from the memory cells MC1 to MC8. In this case, the read data may be [11111101]. That the read data are [11111101] may mean that a write failure occurs at the seventh memory cell MC7 of the memory cells MC1 to MC8. The data of [11111101] read as a result of the second pattern write operation may be stored in the separate storage circuit.

Afterwards, in a third pattern write operation, the test device 110 may generate [11111111] as a third pattern, based on the stored data (i.e., [11110111] and [11111101]). The third pattern of [11111111] thus generated may be written in the memory cells MC1 to MC8. Afterwards, the test device 110 may read data from the memory cells MC1 to MC8. In this case, the read data may be [11110111]. That the read data are [11110111] may mean that a write failure occurs at the fifth memory cell MC5 of the memory cells MC1 to MC8. The data of [11110111] read as a result of the third pattern write operation may be stored in the separate storage circuit.

Afterwards, in a fourth pattern write operation, the test device 110 may generate [1111X111] as a fourth pattern, based on the stored data (i.e., [11110111], [11111101], and [11110111]). For example, the test device 110 may check that a write failure occurs at the fifth memory cell MC5 two times in the previous pattern write operations, based on the pieces of stored data. In this case, the test device 110 may generate the fourth pattern, that is, [1111X111] such that a write operation for the fifth memory cell MC5 is skipped in a next pattern write operation. As described above, a reference sign or bit value corresponding to "X" may be for emphasizing that a write operation for a corresponding memory cell is skipped, and may be replaced with a value of bit "0".

The test device 110 may write the fourth pattern, that is, [1111X111] in the memory cells MC1 to MC8. In this case, the write operation for the fifth memory cell MC5 corresponding to "X" may be skipped. Afterwards, the test device 110 may read data from the memory cells MC1 to MC8. The read data may be [11110110]. The reason that a value corresponding to the fifth memory cell MC5 is bit "0" is that the write operation for the fifth memory cell MC5 is skipped, and that a value corresponding to the eighth memory cell MC8 is bit "0" may indicate that a write failure occurs at the eighth memory cell MC8. This may be checked by comparing the written fourth pattern with the read data. The read data of [11110110] may be stored in the separate storage circuit.

Afterwards, in a fifth pattern write operation, the test device 110 may generate [1111X111] as a fifth pattern, based on the stored data (i.e., [11110111], [11111101], [11110111], and [11110110]) and may write the fifth pattern thus generated in the memory cells MC1 to MC8. Afterwards, the test device 110 may read data from the memory cells MC1 to MC8, and the read data may be [11110101]. A meaning of each bit of the read data is described above, and thus, additional description will be omitted to avoid redundancy.

Afterwards, in a sixth pattern write operation, the test device 110 may generate [1111X1X1] as a sixth pattern, based on the stored data (i.e., [11110111], [11111101], [11110111], [11110110], and [11110101]). In this case, as described above, the reason that bit values respectively corresponding to the fifth and seventh memory cells MC5 and MC7 are "X" is that a write failure occurs at each of the fifth and seventh memory cells MC5 and MC7 two times or more in the previous pattern write operations, and is for skipping the write operation for the fifth and seventh memory cells MC5 and MC7. The test device 110 may write the sixth pattern in the memory cells MC1 to MC8. Afterwards, the test device 110 may read data from the memory cells MC1 to MC8, and the read data may be [11110100]. A meaning of each bit of the read data is described above, and thus, additional description will be omitted to avoid redundancy.

As described above, the test device 110 may generate a test pattern for a current pattern write operation based on results of previous pattern write operations. In detail, the test device 110 may generate a pattern to be used in a current pattern write operation based on results of previous pattern write operations, such that a write operation for memory cells where a write failure occurs as much as the threshold number of times or more may be skipped. In an exemplary embodiment, the threshold number of times to be used to determine memory cells where a write operation is to be skipped may be decided according to various conditions. For example, the threshold number of times may be decided based on at least one of the iterative number of times of a pattern write operation, an error correction capability of an ECC engine, a size of an ECC block, a size of a data word, and the number of memory cells connected with one word line.

Although not illustrated in drawings, the test device 110 may generate a pattern to be used in a current pattern write operation, based on results belonging to a specific range from among results of previous pattern write operations. For example, it is assumed that the test device 110 performs a pattern write operation for the memory cells MC1 to MC8 iteratively "n" times. In this case, the test device 110 may generate a pattern for a k-th pattern write operation based on results of i-th to (k−1)-th pattern write operations. That is, in the case of generating a pattern to be used in a current pattern write operation, the test device 110 may generate a pattern based on results belonging to a specific period from among results of previous pattern write operations.

Although not illustrated in drawings, the test device 110 may generate a pattern based on results of previous pattern write operations, such that a write operation for memory cells where a write failure continuously (e.g., successively) occurs as much as the given number of times is skipped. That is, that a write failure continuously occurs at a specific memory cell as much as the given number of times may mean that the probability that a write failure occurs at the specific memory cell is very high. Accordingly, the test device 110 may allow specific memory cells to maintain failure information during iterative pattern write operations by skipping the write operation for the specific memory cells having a high probability that a write failure occurs.

Figure 9:
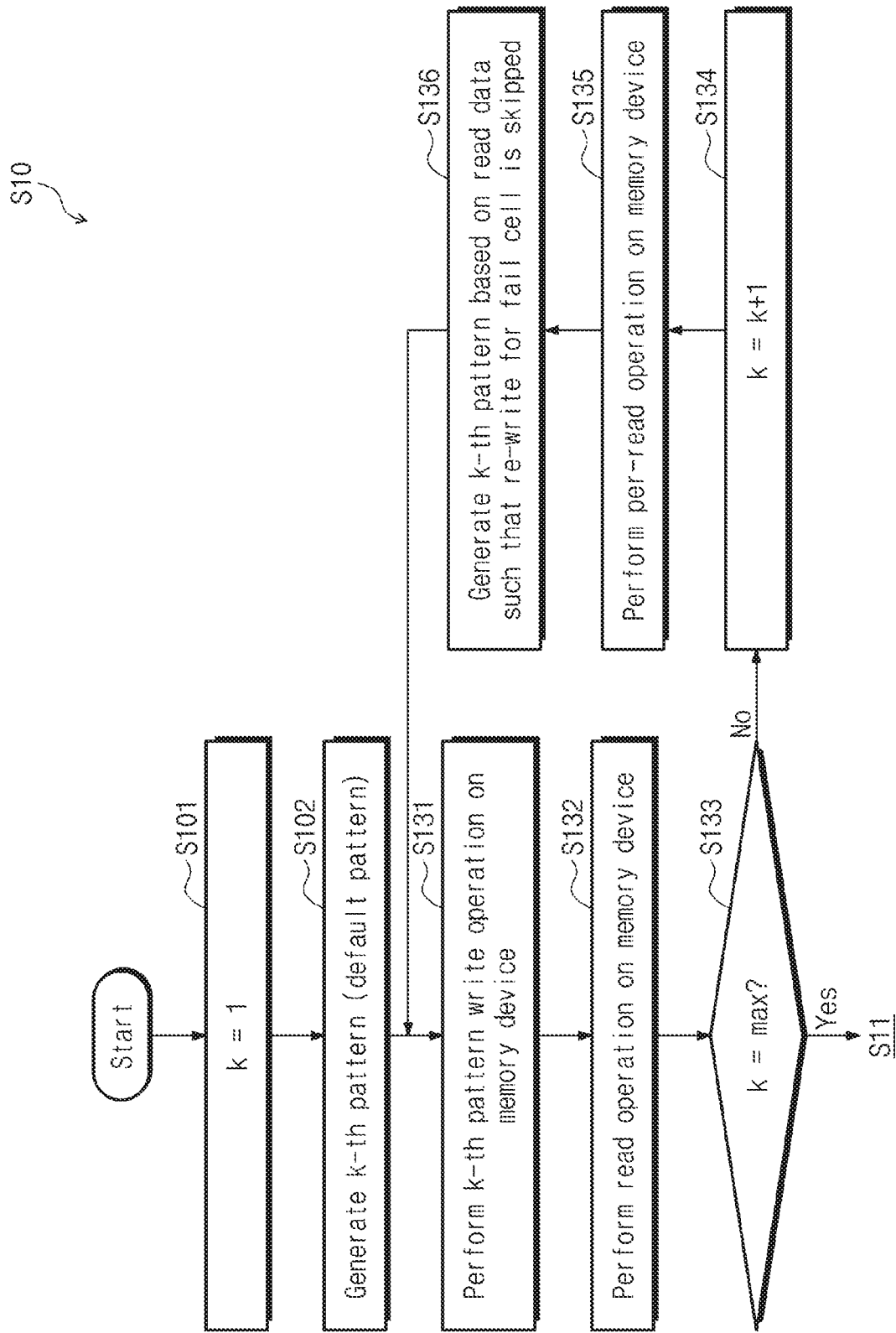
FIG. 9 illustrates a flowchart of iterative pattern write operations corresponding to operation S10 of FIG. 4.

FIG. 9 illustrates a flowchart of iterative pattern write operations corresponding to operation S10 of FIG. 4. FIG. 10 is a diagram descriptive of an operation according to the flowchart of FIG. 9. For brevity of illustration and for convenience of description, additional and/or repeated description associated with the components described above will be omitted to avoid redundancy.

Referring to FIGS. 1, 4, 9, and 10, the test device 110 performs operation S101, operation S102, and operation S131 to operation S134. Operation S101 and operation S102 are described with reference to FIG. 5, and operation S131 to operation S134 are similar to operation S111 to operation S114 of FIG. 5. Thus, additional description will be omitted to avoid redundancy.

In operation S135, the test device 110 performs a pre-read operation on the memory device 120. For example, the pre-read operation in operation S135 may be characterized as a pre-read operation that is performed before the subsequent k-th pattern write operation in operation S131. For example, the read operation in operation S132 may be a post-read operation that is performed immediately after the pattern write operation is completed, and the read operation in operation S135 may be the pre-read operation after a given time elapses from a time at which the pattern write operation is completed. In an exemplary embodiment, read results in operation S132 and operation S135 may be temporarily stored in a separate storage circuit.

In operation S136, the test device 110 may generate a k-th pattern based on read data of the post-read operation and the pre-read operation. In this case, the k-th pattern may be generated such that the re-write operation for a failure cell is skipped.

For example, as illustrated in FIG. 10, in a first pattern write operation, the test device 110 may generate [11111111] as a first pattern (i.e., a default pattern). The test device 110 may write the first pattern of [11111111] in the memory cells MC1 to MC8 of the memory device 120 and may then immediately read data from the memory cells MC1 to MC8 (i.e., the post-read operation). In this case, the read data may be [11110111], and this may mean that a write failure occurs at the fifth memory cell MC5.

Afterwards, in a second pattern write operation, the test device 110 may read data from the memory cells MC1 to MC8 before generating a second pattern (i.e., the pre-read operation). In this case, the read data (i.e., the pre-read data) for the second pattern write operation may be [11110110], and this may mean that a write failure occurs at the fifth and eighth memory cells MC5 and MC8. In an exemplary embodiment, the write failure detected from the data read through the post-read operation may mean a write failure (e.g., an immediate write fail) that occurs during the write operation or immediately after the write operation. In contrast, the write failure detected from the data read through the pre-read operation may mean a write failure (e.g., a delayed write fail) that does not occur during the write operation or immediately after the write operation but occurs over time. That is, through data read through the post-read operation in the first pattern write operation, it may be checked that the immediate write failure occurs at the fifth memory cell MC5, and through data read through the pre-read operation in the second pattern write operation it may be checked that the delayed write failure occurs at the eighth memory cell MC8.

The test device 110 may then generate [1111X11X] as a second pattern, based on a result (e.g., [11110111]) of the post-read operation in the previous pattern write operation and a result (e.g., [11110110]) of the pre-read operation in the current pattern write operation. In this case, the second pattern of [1111X11X] may be set such that the re-write operation for the fifth and eighth memory cells MC5 and MC8 where a write failure occurs is skipped. The test device 110 may write the second pattern of [1111X11X] in the memory cells MC1 to MC8 and may perform the post-read operation on the memory cells MC1 to MC8 to read data of [11110110].

Afterwards, as in the above description, the test device 110 may perform a third pattern write operation. For example, the test device 110 may perform the pre-read operation on the memory cells MC1 to MC8 to read data of [11010110] for the third pattern write operation. In this case, the data of [11010110] may mean that the delayed write failure occurs at the third memory cell MC3. As in the above description, the test device 110 may generate a third pattern of [11X1X11X] such that the re-write operation for the third, fifth, and eighth memory cells MC3, MC5, and MC8 is skipped and may write the generated pattern in the memory cells MC1 to MC8. Afterwards, the test device 110 may perform the post-read operation on the memory cells MC1 to MC8 to read data of [10010110]. The data of [10010110] may mean that the immediate write failure occurs at the second memory cell MC2.

Although not illustrated in drawings, in the case of iteratively performing the pattern write operation described above, the test device 110 may detect memory cells where various kinds of write failures (e.g., an immediate write failure and a delayed write failure) occur and may skip the re-write operation for memory cells at which a write failure occurs, in the pattern write operation.

Figure 11:
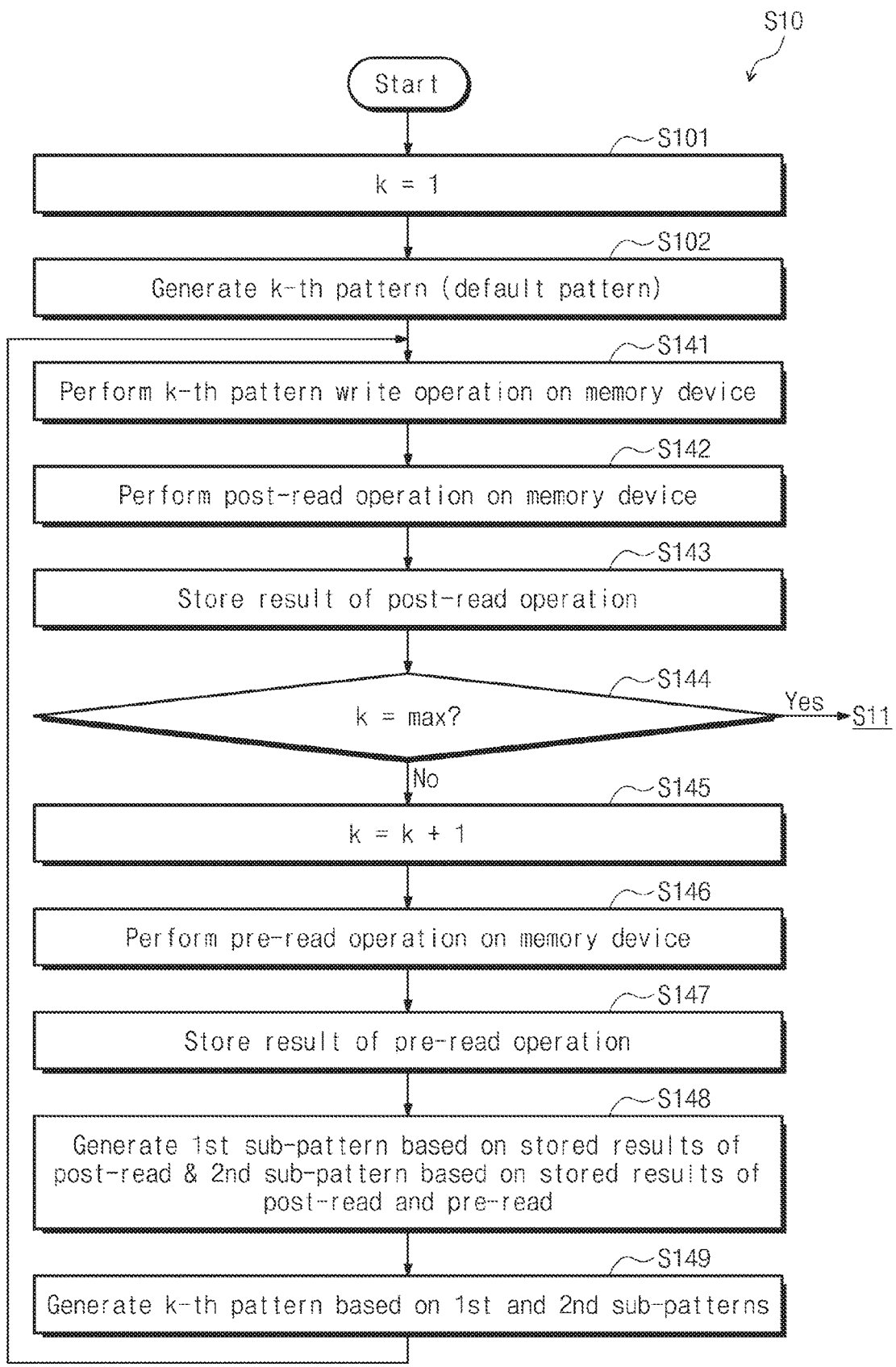
FIG. 11 illustrates a flowchart of iterative pattern write operations corresponding to operation S10 of FIG. 4.

FIG. 11 illustrates a flowchart of iterative pattern write operations corresponding to operation S10 of FIG. 4. FIG. 12 illustrates a diagram descriptive of an operation according to the flowchart of FIG. 11. For brevity of illustration and for convenience of description, additional and repeated description associated with the components described above will be omitted to avoid redundancy.

Referring to FIGS. 1, 4, 11, and 12, the test device 110 may perform operation S101, operation S102, and operation S141 to operation S147. Operation S101 and operation S102 are described with reference to FIG. 5, and operation S141 to operation S147 are similar to operation S111 to operation S114 of FIG. 5, except that read result are additional stored in FIG. 11 in operations S143 and S147. Thus, additional description will be omitted to avoid redundancy.

In operation S148, the test device 110 generates a first sub-pattern based on the stored results of the post-read operations, and generates a second sub-pattern based on the stored results of the post-read operations and the pre-read operations. Afterwards, in operation S149, the test device 110 generates a k-th pattern based on the first and second sub-patterns. Afterwards, the test device 110 may proceed to operation S141.

In an exemplary embodiment, in the case of generating a pattern, different conditions may be applied depending on a type of a write failure, through operation S148 and operation S149. For example, as illustrated in FIG. 12, in a first pattern write operation, the test device 110 may generate [11111111] as a first pattern (i.e., a default pattern) and may write the first pattern [11111111] in the memory cells MC1 to MC8. Afterwards, the test device 110 may perform the post-read operation on the memory cells MC1 to MC8 to read data of [11110111]. A meaning of each bit of the read data is similar to that described above, and thus, additional description will be omitted to avoid redundancy.

Afterwards, in a second pattern write operation, the test device 110 may perform the pre-read operation on the memory cells MC1 to MC8 to read data of [1110110]. The test device 110 may generate [1111X111] as a first sub-pattern, based on a result (e.g., [11110111]) of a previous post-read operation (i.e., a post read result in the first pattern write operation). In this case, the first sub-pattern of [1111X111] may be identical or similar to the result of the previous post-read operation. That is, in the first sub-pattern, a bit value corresponding to a failure cell may be set to a reference sign of "X", based on the result of the previous post-read operation. In an exemplary embodiment, in the first sub-pattern, a memory cell corresponding to the reference sign of "X" may be a memory cell corresponding to the immediate write failure or a memory cell where the re-write operation is skipped in a previous pattern write operation.

The test device 110 may generate the second sub-pattern, based on a result of the post-read operation in the previous pattern write operation and a result of the pre-read operation in the current pattern write operation. For example, in the second pattern write operation, a result of the post-read operation in the previous pattern write operation (i.e., the first pattern write operation) may be [11110111], and a result of the pre-read operation in the current pattern write operation (i.e., the second pattern write operation) may be [11110110]. The second sub-pattern may be generated by performing a logical operation (e.g., XNOR or XOR) on the results. In the example described above, the second sub-pattern of [1111111X] may be generated. This may mean that the delayed write failure occurs at the eighth memory cell MC8.

The test device 110 may generate a pattern to be used in a current pattern write operation based on the first sub-pattern and the second sub-pattern. For example, as described above, the first sub-pattern may include information about memory cells corresponding to the immediate write failure or memory cell where the re-write operation is skipped, and the second sub-pattern may include information about memory cells corresponding to the delayed write fail. The test device 110 may apply a first reference value being relatively small with regard to the immediate write failure and may apply a second reference value being relatively great with regard to the delayed write fail.

For convenience of description, in the embodiment of FIG. 12, it is assumed that the first reference value is "1" and the second reference value is "2". In the second pattern write operation, the first sub-pattern may include information about the fifth memory cell MC5 where the immediate write failure occurs, and the second sub-pattern may include information about the eighth memory cell MC8 where the delayed write failure occurs. In this case, the test device 110 may generate a test pattern of [1111X111] such that the re-write operation for the fifth memory cell MC5 where the immediate write failure occurs once is skipped. The second pattern of [1111X111] may be written in the memory cells MC1 to MC8, and data read from the memory cells MC1 to MC8 through the post-read operation may be [11100111].

Afterwards, in a third pattern write operation, data read through the pre-read operation may be [11100110]. In this case, as in the above description, the first sub-pattern may be [1111XX11], and the second sub-pattern may be [1111111X]. In this case, that the immediate write failure occurs at the fourth and fifth memory cells MC4 and MC5 or that the fourth and fifth memory cells MC4 and MC5 are memory cells where the re-write operation is skipped (i.e., where a write failure occurs) may be checked through the first sub-pattern. That the delayed write failure occurs at the eighth memory cell MC8 two times may be checked through the second sub-pattern. In this case, the test device 110 may generate a third pattern of [111XX111X] such that the re-write operation for the fourth, fifth, and eighth memory cells MC4, MC5, and MC8 is skipped. The third pattern thus generated may be written in the memory cells MC1 to MC8, and data of [11100110] may be read from the memory cells MC1 to MC8 through the post-read operation.

Afterwards, in a fourth pattern write operation, a result of the pre-read operation may be [11000110], a first sub-pattern may be [111XX11X], a second sub-pattern may be [11X11111], a fourth pattern may be [111XX11X], and data corresponding to a result of the post-read operation may be [11100110]. A technical meaning of each bit value and each pattern is similar to those described above, and thus, additional description will be omitted to avoid redundancy.

The embodiments are described above as the test device 110 iteratively performs the pattern write operation as much as the given number of times, but the inventive concepts are not limited thereto. For example, although not illustrated in drawings, in the case where the number of memory cells determined as a failure cell exceeds the reference value while the test device 110 iteratively performs the pattern write operation, the test device 110 may stop the remaining pattern write operations and may perform the repair operation or the screen operation on the memory device 120.

As described above, the test device 110 may determine failure cells based on a condition that is variable depending on a type of a write failure (e.g., a reference value associated with the number of times of occurrence being variable) in the process of iteratively writing a test pattern. In this case, the test device 110 may generate a test pattern such that the re-write operation for memory cells determined as failure cells is skipped.

Figure 13:
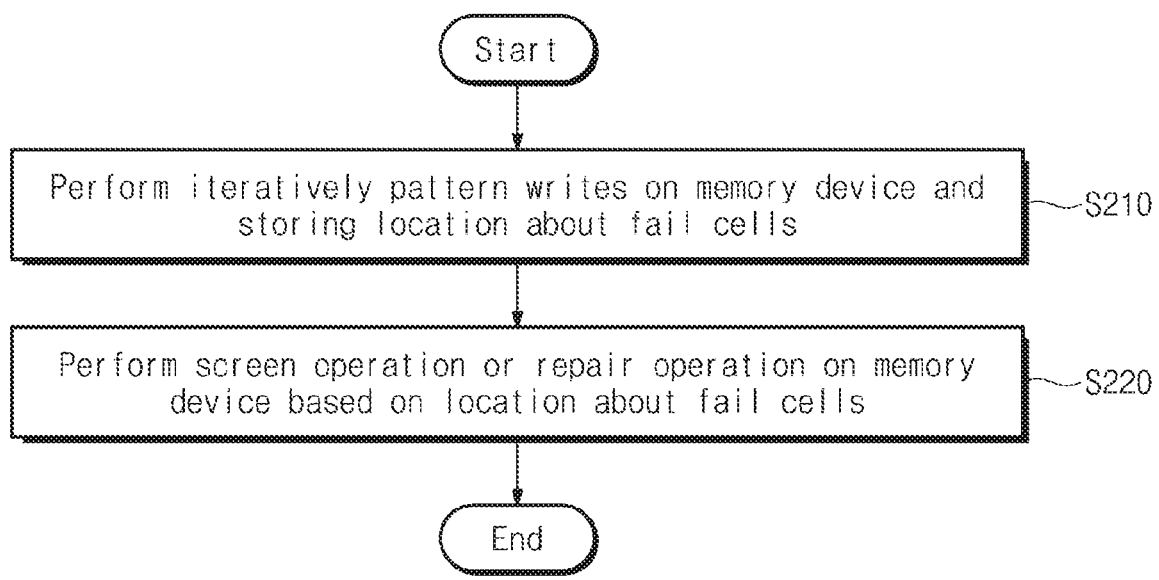
FIG. 13 illustrates a flowchart of an operation of a test device according to embodiments of the inventive concepts.
Figure 14:
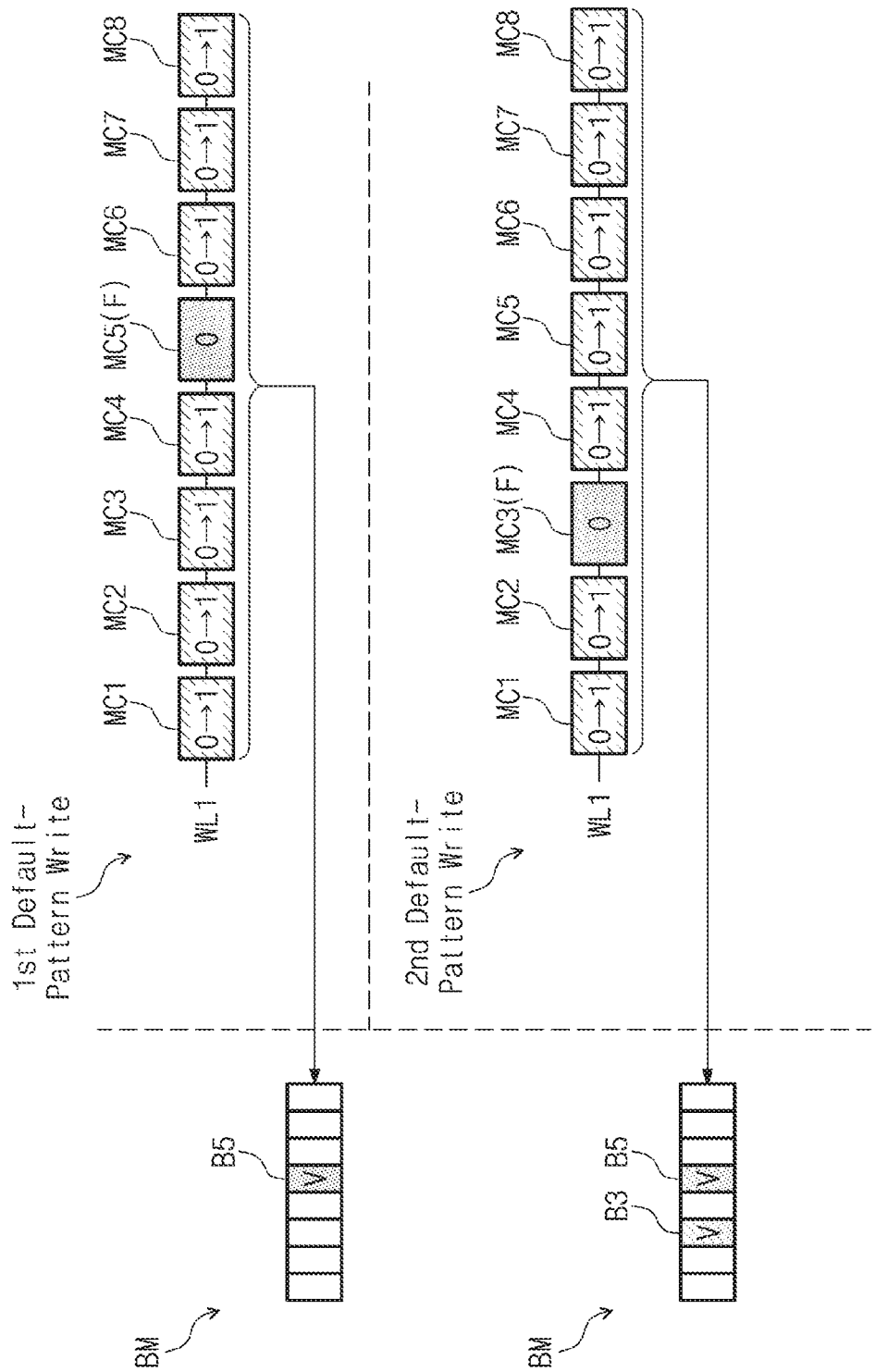
FIG. 14 illustrates a diagram descriptive of an operation according to the flowchart of FIG. 13.

FIG. 13 illustrates a flowchart of an operation of a test device according to embodiments of the inventive concepts. FIG. 14 illustrates a diagram descriptive of an operation according to the flowchart of FIG. 13. For convenience of description, additional and repeated description associated with the components described above will be omitted to avoid redundancy. Referring to FIGS. 1, 13, and 14, in operation S210, the test device 110 iteratively performs a pattern write operation for the memory device 120 and an operation of storing locations of failure cells.

In operation S220, the test device 110 performs the repair operation or the screen operation on the memory device 120 based on location information about failure cells.

For example, as illustrated in FIG. 14, the test device 110 may write a default pattern (e.g., [11111111]) in the memory cells MC1 to MC8 through a first default pattern write operation. In this case, a write failure may occur at the fifth memory cell MC5. The test device 110 may store information indicating that a write failure occurs at the fifth memory cell MC5. For example, the test device 110 may store information indicating that a write failure occurs at the fifth memory cell MC5, by marking a fifth bit B5 of a bitmap BM. Afterwards, the test device 110 may write the default pattern (e.g., [11111111]) in the memory cells MC1 to MC8 through a second default pattern write operation. In this case, a write failure may occur at the third memory cell MC3. The test device 110 may store information indicating that a write failure occurs at the third memory cell MC3, by marking a third bit B3 of the bitmap BM. For example, in some embodiments the test device 110 stores the bit map BM in a separate storage circuit in the test device 110.

As described above, the test device 110 may store location information about a failure cell in the separate bitmap BM. In this case, even though failure cells do not occur at the same time, because locations of failure cells occurring in the iteration of the pattern write operation are accumulated, the accuracy of detection of the write failure may be improved.

Figure 15:
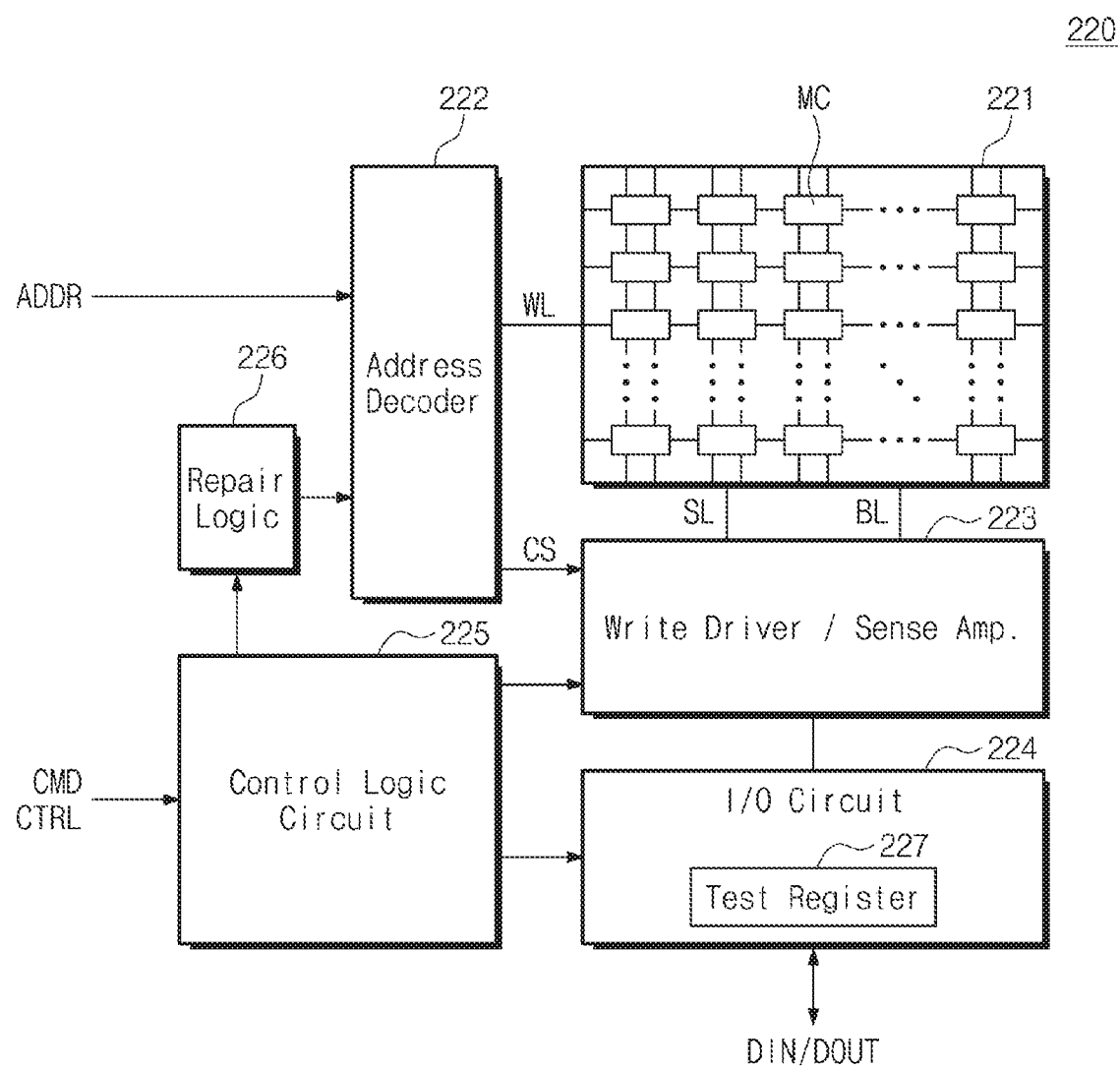
FIG. 15 illustrates a block diagram of a memory device according to embodiments of the inventive concepts.

FIG. 15 illustrates a block diagram of a memory device according to embodiments of the inventive concepts. Referring to FIG. 15, a memory device 220 may include a memory cell array 221, an address decoder 222, a driving circuit 223, an input/output circuit 224, a control logic circuit 225, and repair logic (e.g., circuitry) 226. The input/output circuit 224 may include a test register 227. The memory cell array 221, the address decoder 222, the driving circuit 223, the input/output circuit 224, the control logic circuit 225, and the repair logic 226 are described with reference to FIG. 2, and thus, additional and repeated description will be omitted to avoid redundancy.

Embodiments where the test device 110 generates a pattern or a test pattern such that the re-write operation for failure cells is skipped are described with reference to FIGS. 1 to 14. However, the inventive concepts are not limited thereto. For example, an operation of generating a pattern such that the re-write operation for failure cells is skipped may be performed by the memory device 220.

For example, the test register 227 may be configured to temporarily store data read from the memory cell array 221 during a test operation of the memory device 220. The memory device 220 may generate a pattern by combining a default pattern received from the test device 110 (refer to FIG. 1) and data stored in the test register 227. In this case, the pattern may be generated such that the re-write operation for a failure cell is skipped. The manner in which the memory device 220 may generate a pattern by using the test register 227 will be described hereinafter with reference to drawings.

Figure 16:
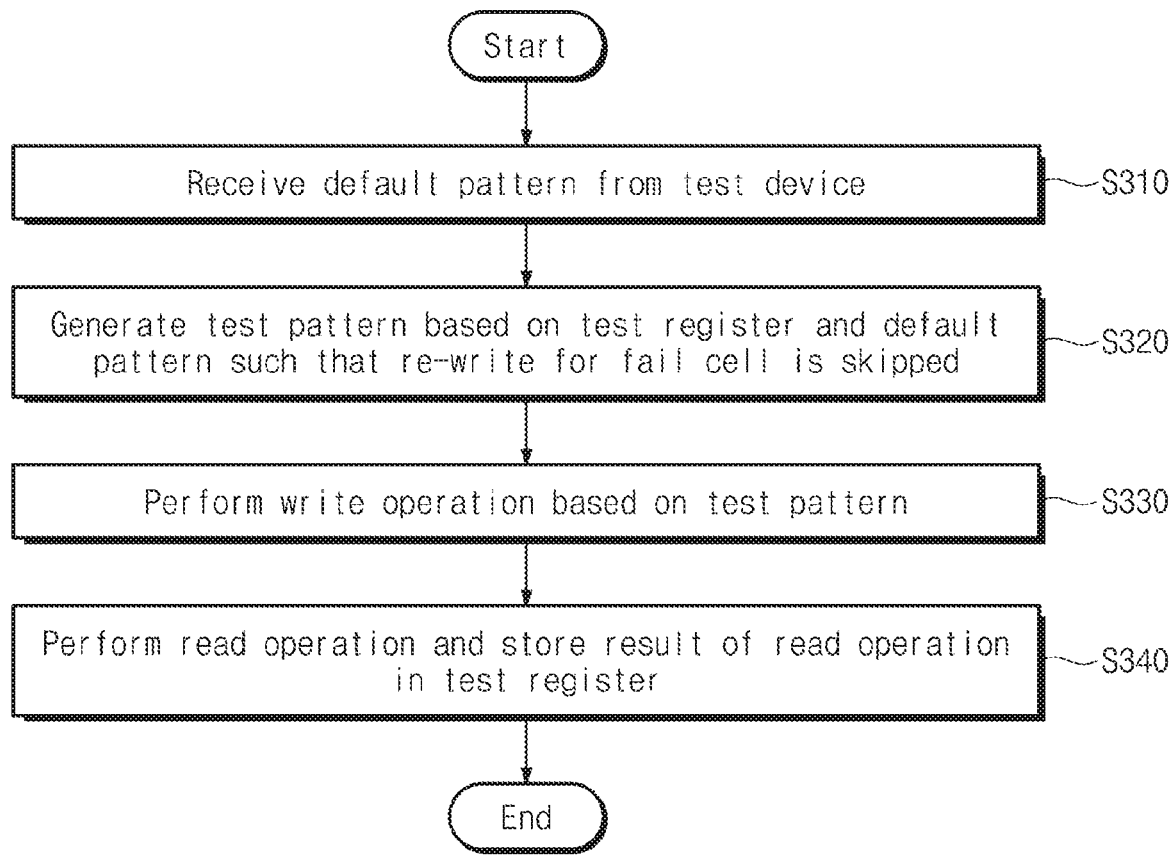
FIG. 16 illustrates a flowchart of an operation of the memory device of FIG. 15.
Figure 17:
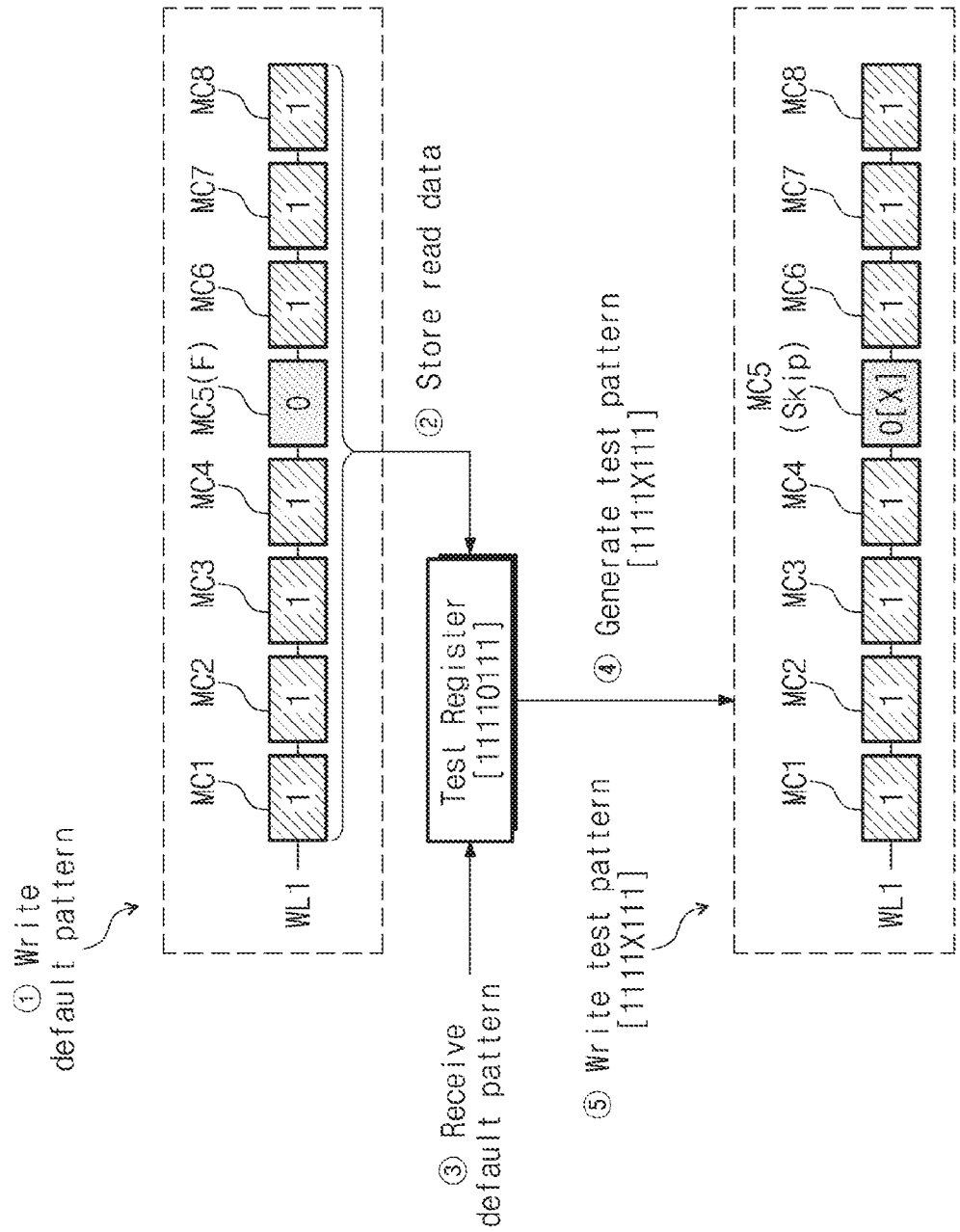
FIG. 17 illustrates a diagram descriptive of an operation according to the flowchart of FIG. 16.

FIG. 16 illustrates a flowchart of an operation of the memory device of FIG. 15. FIG. 17 illustrates a diagram descriptive of an operation according to the flowchart of FIG. 16.

Referring to FIGS. 1 and 15 to 17, in operation S310, the memory device 220 receives a default pattern from the test device 110. In an exemplary embodiment, the default pattern may be variously set depending on a test target or scheme of the test device 110. For example, as described above, a pattern for determining whether bit "1" is normally stored in a memory cell may be a bit stream (that is, all one bits) composed of bit "1". For example, the default pattern may be received from the test device 110 (see FIG. 1) or a memory controller external of the memory device 220, via I/O circuit 224.

In operation S320, the memory device 220 generates a test pattern based on a default pattern and the test register 227. For example, the memory device 220 may iteratively perform the pattern write operation under control of the test device 110. In this case, the test register 227 may be configured to store a result of a previous pattern write operation (i.e., data in which information about a failure cell is included). The memory device 220 may generate a test pattern by combining the result of the previous pattern write operation stored in the test register 227 and the default pattern. In this case, the test pattern may be generated such that the re-write operation for a failure cell is skipped. For example, the control logic circuit 225 may control the driving circuit 223 and the input/output circuit 224 including the test register 227, to generate the test pattern and to perform the re-write operation.

In operation S330, the memory device 220 performs the write operation based on the test pattern. In an exemplary embodiment, because the test pattern generated in operation S320 is set such that the re-write operation for a failure cell is skipped, the re-write operation for a failure cell may be skipped during the write operation in operation S330.

In operation S340, the memory device 220 performs a read operation and stores a result of the read operation in the test register 227. In an exemplary embodiment, the result of the read operation stored in the test register 227 may include information about failure cells occurring in the write operation in operation S330 and previous write operations. The result of the read operation stored in the test register 227 may be used to generate a test pattern for a next pattern write operation.

For example, as illustrated in FIG. 17, in operation ①, the memory device 220 writes the default pattern (e.g., [11111111]) in the memory cells MC1 to MC8 connected with the first word line WL1. For example, a write failure may occur at the fifth memory cell MC5. In this case, data read from the memory cells MC1 to MC8 may be [11110111]. Afterwards, in operation ②, the memory device 220 stores the data read from the memory device 220, that is [11110111], in the test register 227.

Afterwards, in operation ③, the memory device 220 receives the default pattern (i.e., [11111111]) from the test device 110. Afterwards, in operation ④, the memory device 220 generates a test pattern based on the received default pattern (i.e., [11110111]) and the data stored in the test register 227. In this case, because the data stored in the test register 227 indicates that a write failure occurs at the fifth memory cell MC5, a test pattern may be generated such that the re-write operation for the fifth memory cell MC5 is skipped. That is, the test pattern thus generated may be [1111X111].

Afterwards, in operation ⑤, the memory device 220 writes the test pattern in the memory cells MC1 to MC8. In this case, because the test pattern is generated such that the re-write operation for the fifth memory cell MC5 is skipped, during the write operation of ⑤, the re-write operation or write operation for the fifth memory cell MC5 (i.e., a failure cell) may be skipped.

As described above, the memory device 220 according to embodiments of the inventive concepts may store information about a failure cell by using the test register 227 separately, and the memory device 220 may generate a test pattern by using the test register 227 such that the re-write operation for a failure cell is skipped.

In an exemplary embodiment, the test register 227 may be a dedicated storage circuit for generating a test pattern at the memory device 220. Alternatively, although not illustrated in drawings, the test register 227 may be a register for read/write, which is included in the input/output circuit 224 for the purpose of performing a read operation or a write operation at the memory device 220.

Figure 18A:
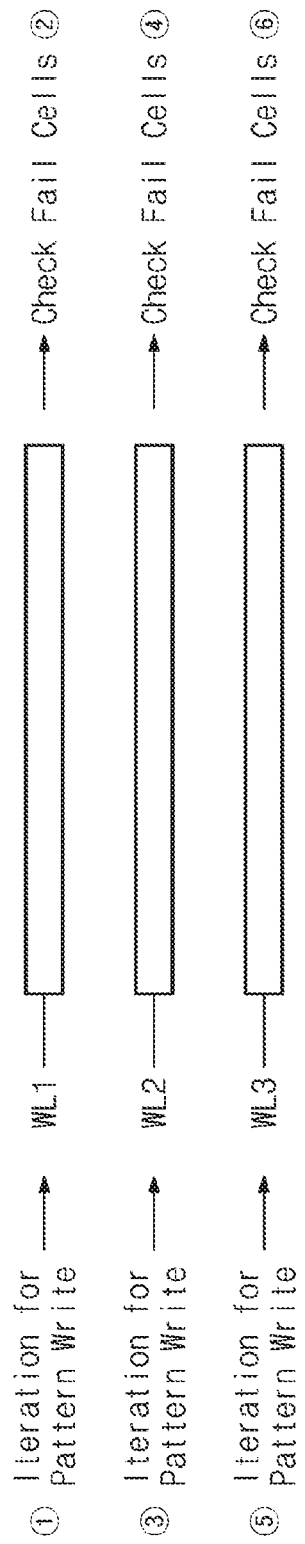
FIGS. 18A and 18B illustrate diagrams descriptive of a test operation according to embodiments of the inventive concepts.
Figure 18B:
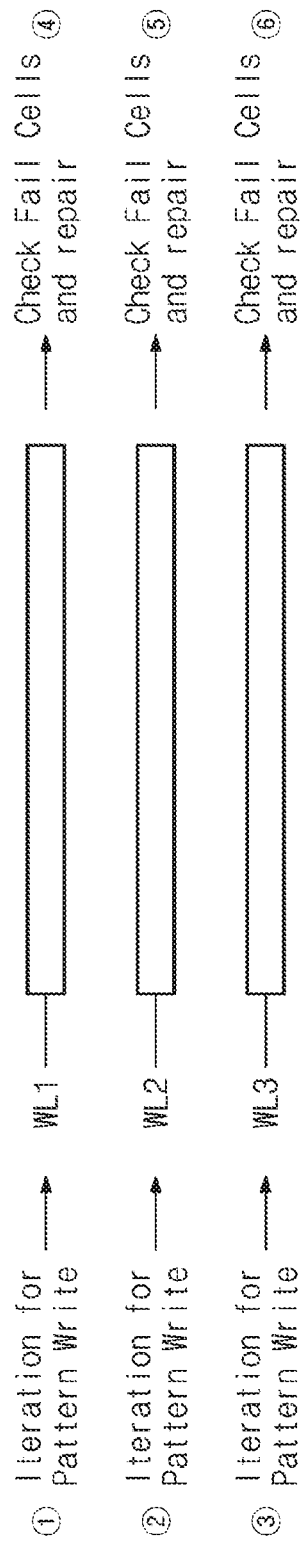

FIGS. 18A and 18B illustrate diagrams descriptive of a test operation according to embodiments of the inventive concept. For convenience of description, it is assumed that a test operation is performed in units of a word line of a memory device. Also, for brevity of illustration, only word lines of the memory device are illustrated in FIGS. 18A and 18B. However, the inventive concepts are not limited thereto.

Referring to FIGS. 1, 18A, and 18B, the test device 110 may perform the test operation on memory cells connected with first to third word lines WL1 to WL3 of the memory device 120. In this case, as illustrated in FIG. 18A, the test device 110 performs the pattern write operation for the first word line WL1 as much as the given number of times (①). In an exemplary embodiment, the iteration of the pattern write operation may be performed based on operation methods described with reference to FIGS. 1 to 17.

Afterwards, the test device 110 checks failure cells associated with the first word line WL1 (②). For example, in the case where the iteration of the pattern write operation associated with the first word line WL1 is completed, failure cells of memory cells connected with the first word line WL1 may be in a state of storing a value different from a value of a default pattern. The test device 110 may read data from the memory cells connected with the first word line WL1 and may decide the number of failure cells based on the number of cells having a different value from that of the default pattern. In an exemplary embodiment, when the number of failure cells exceeds a reference value, the test device 110 may perform the repair operation or the screen operation on the memory device 120.

Afterwards, the test device 110 iteratively performs the pattern write operation associated with the second word line WL2 (③). Afterwards, the test device 110 checks failure cells associated with the second word line WL2 (④). Afterwards, the test device 110 iteratively performs the pattern write operation associated with the third word line WL3 (⑤). Afterwards, the test device 110 checks failure cells associated with the third word line WL3 (⑥).

Alternatively, as illustrated in FIG. 18B, the test device 110 may sequentially perform the iteration of the pattern write operation with regard to the first to third word lines WL1 to WL3 (①→②→③). Afterwards, the test device 110 may sequentially perform a failure cell check with regard to the first to third word lines WL1 to WL3 (④→⑤→⑥). The above order of the test operation is exemplary, and the inventive concepts are not limited thereto.

Figure 19:
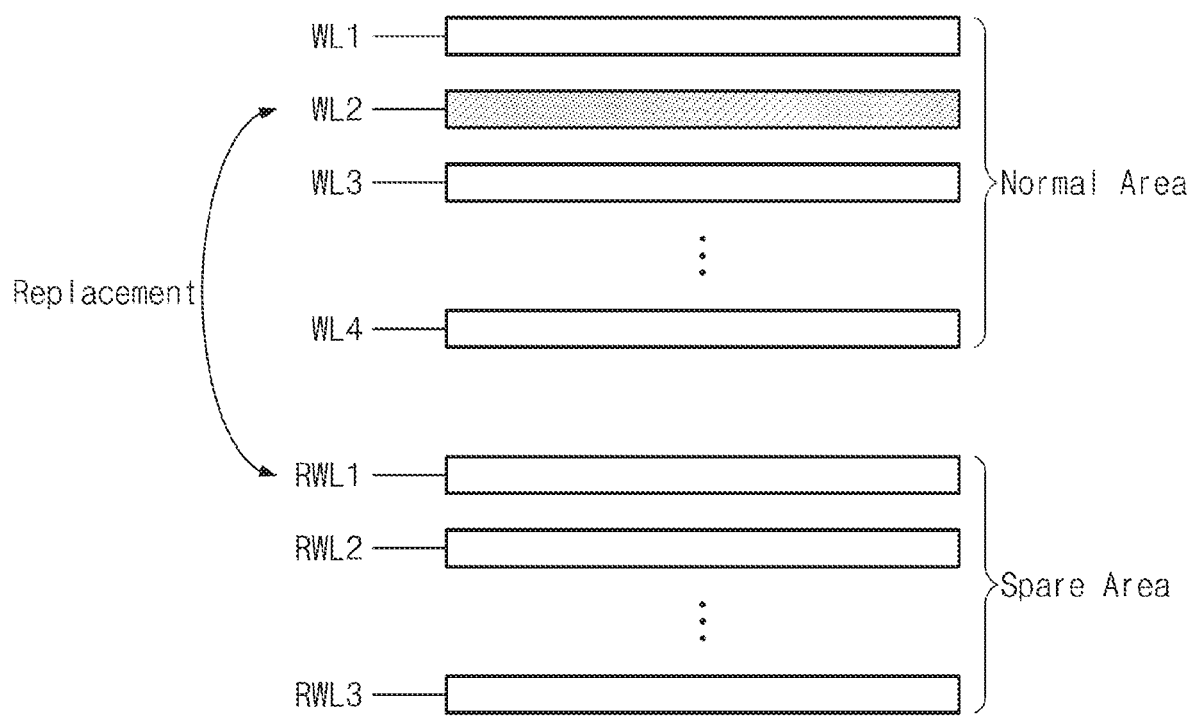
FIG. 19 illustrates an exemplary diagram descriptive of a repair operation for a memory device.

FIG. 19 illustrates an exemplary diagram descriptive of a repair operation for a memory device. Referring to FIGS. 1, 2, and 19, the test device 110 may perform the repair operation on the memory device 120 when it is determined through the test operations described with reference to FIGS. 1 to 18B that the number of failure cells exceeds a reference value in a given unit.

For example, the memory cell array 121 of the memory device 120 may include a normal area and a spare area. The normal area may include a plurality of word lines WL1 to WLn, and the spare area may include a plurality of spare word lines RWL1 to RWLm. Hereinafter, for purposes of explanation only and to provide clear description of the inventive concepts, embodiments will be described wherein n=4 and m=3. However, the inventive concepts are not limited thereto and any number of word lines WL and spare word lines RWL may be respectively included in the normal and spare areas.

The test device 110 may perform a test operation on the normal area. In this case, the number of failure cells of memory cells connected with the second word line WL2 may exceed a reference value. In this case, the test device 110 may replace the second word line WL2 with one (e.g., RWL1) of the spare word lines RWL1 to RWLm of the spare area. In an exemplary embodiment, to replace a word line may mean that a spare word line is accessed instead of a specific word line when an address for the specific word line is applied. This word line replacement may be performed by the repair logic 126. That is, the test device 110 may set the repair logic 126 of the memory device 120 such that a word line (e.g., WL2) where there are detected failure cells, the number of which is equal to or more than the reference value, is replaced with a spare word line (e.g., RWL1) of the spare area.

Figure 20:
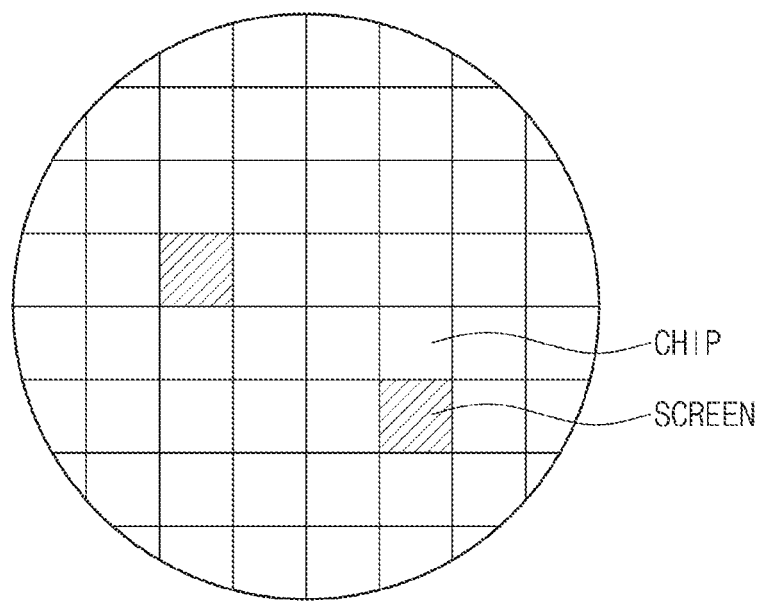
FIG. 20 illustrates an exemplary diagram descriptive of a screen operation for a memory device.

FIG. 20 illustrates an exemplary diagram descriptive of a screen operation for a memory device. Referring to FIGS. 1, 2, and 20, the memory device 120 may be formed on a semiconductor wafer WF. That is, the semiconductor wafer WF may include a plurality of semiconductor chips CHIP, and each of the plurality of semiconductor chips CHIP may be the memory device 120.

The test device 110 may perform the test operation on the plurality of semiconductor chips CHIP included in the semiconductor wafer WF based on the operation methods described with reference to FIGS. 1 to 18B. In this case, in the case where failure cells detected from a specific semiconductor chip of the plurality of semiconductor chips CHIP are incapable of being repaired through the repair operation, the specific semiconductor chip may be screened such that the specific semiconductor chip is not used. In an exemplary embodiment, the case where the detected failure cells are incapable of being repaired through the repair operation may include at least one of various conditions such as the case where the number of word lines connected with failure cells, the number of which is equal to or more than a reference value, is more than the number of spare word lines, the case where failure cells appear in the form of a column, and the case where the number of failure cells is equal to or more than a specific ratio of all the memory cells.

Figure 21:
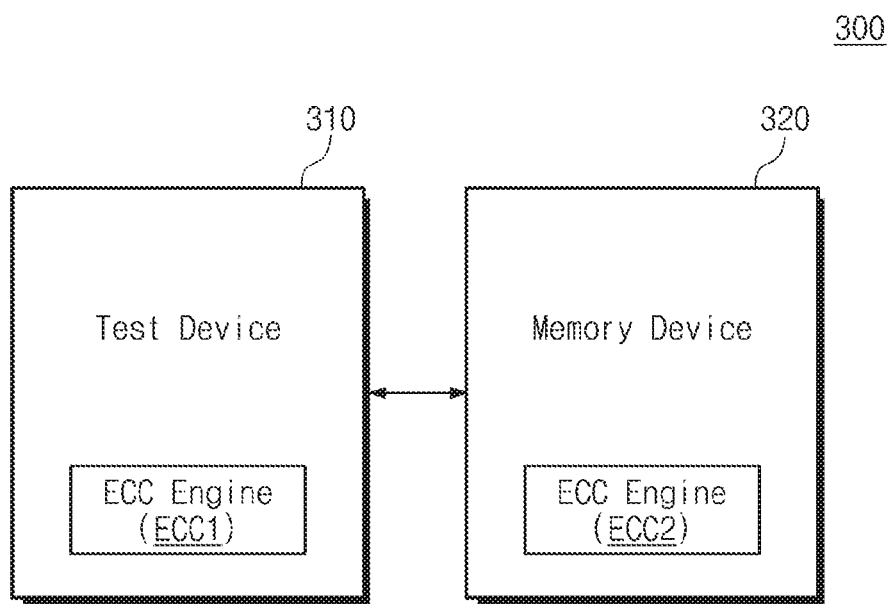
FIG. 21 illustrates a block diagram of a test system according to embodiments of the inventive concepts.

FIG. 21 illustrates a block diagram of a test system according to embodiments of the inventive concepts. Referring to FIG. 21, a test system 300 may include a test device 310 and a memory device 320. The test device 310 and the memory device 320 may operate based on the test methods described with reference to FIGS. 1 to 20.

The test device 310 may include an ECC engine ECC1 configured to correct an error of data read from the memory device 320. Alternatively, the memory device 320 may include an ECC engine ECC2 configured to correct an error of data read from memory cells. In an exemplary embodiment, a reference value for the number of failure cells described with reference to FIGS. 1 to 20 may correspond to an error correction capability of the ECC engines ECC1 and ECC2 described above. Alternatively, instead of determining the number of failure cells, the test device 310 may perform the repair operation or the screen operation depending on whether an error of read data is correctable, by using the ECC engines ECC1 and ECC2.

Figure 22:
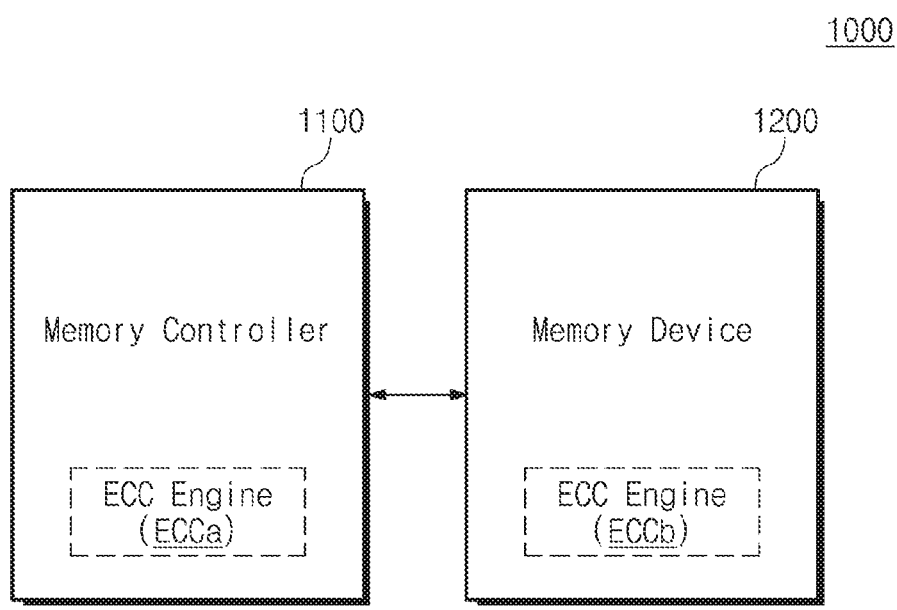
FIG. 22 illustrates a block diagram of a memory system to which a memory device according to embodiments of the inventive concepts may be applied.

FIG. 22 illustrates a block diagram of a memory system to which a memory device according to embodiments of the inventive concepts may be applied. Referring to FIG. 22, a memory system 1000 may include a memory controller 1100 and a memory device 1200. The memory controller 1100 may store data in the memory device 1200 or may read data stored in the memory device 1200. The memory device 1200 may operate under control of the memory controller 1100.

The memory controller 1100 may include an ECC engine ECCa configured to correct an error of data read from the memory device 1200. Alternatively, the memory device 1200 may include an ECC engine ECCa configured to correct an error of data read from memory cells. In an exemplary embodiment, a reference value for the number of failure cells described with reference to FIGS. 1 to 20 may correspond to an error correction capability of the ECC engines ECCa and ECCb described above.

Figure 23:
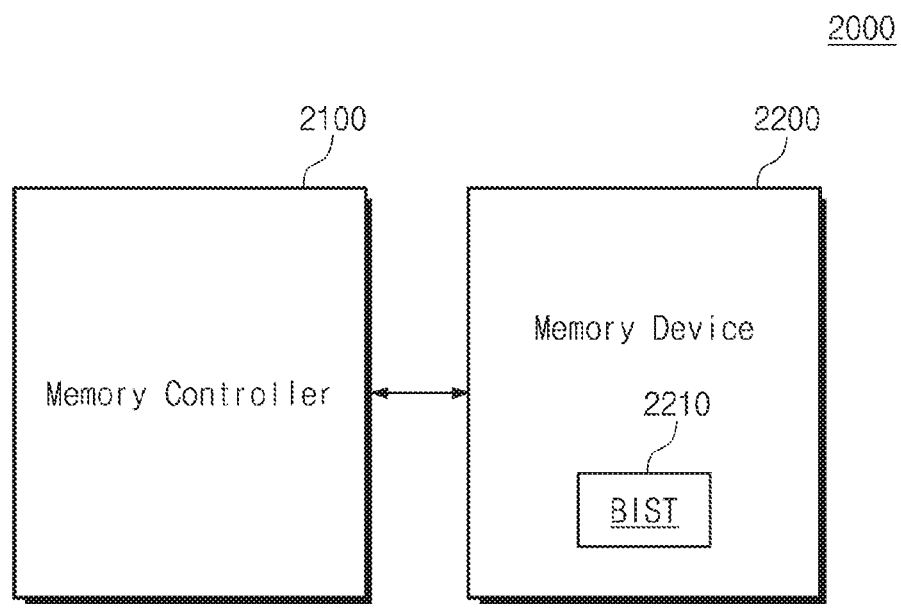
FIG. 23 illustrates a block diagram of a memory system according to embodiments of the inventive concepts.

FIG. 23 illustrates a block diagram of a memory system according to embodiments of the inventive concepts. Referring to FIG. 23, a memory system 2000 may include a memory controller 2100 and a memory device 2200. The memory controller 2100 and the memory devices 2200 are described with reference to FIG. 22, and thus, additional description will be omitted to avoid redundancy.

The memory device 2200 may include built-in-self-test logic (BIST) 2210. The built-in-self-test logic (e.g., circuitry) 2210 may be configured to perform a self-test for the memory device 2200. In an exemplary embodiment, the built-in-self-test logic 2210 may test the memory device 2200 based on the test operations described with reference to FIGS. 1 to 19. That is, the built-in-self-test logic 2210 may iteratively perform the pattern write operation for memory cells and may generate a test pattern such that the re-write operation for a failure cell(s) is skipped while the pattern write operation is iteratively performed. The built-in-self-test logic 2210 may perform the repair operation based on results of the iterative pattern write operations.

The built-in-self-test logic 2210 may be configured to control various components of the memory device 120 described with reference to FIG. 2, for the purpose of performing the above operations. For example, the built-in-self-test logic 2210 may generate a test pattern and may control the driving circuit 123 (refer to FIG. 2) such that the generated test pattern is written in memory cells. The built-in-self-test logic 2210 may allow the driving circuit 123 to read data from the memory cells. The built-in-self-test logic 2210 may generate another test pattern based on the read data and may control the driving circuit 123 such that the generated test pattern is written in the memory cells.

In an exemplary embodiment, instead of generating a test pattern based on a result of a previous pattern write operation, the built-in-self-test logic 2210 may control the driving circuit 123 such that the re-write operation for failure cells is skipped. For example, in the pattern write operation, the built-in-self-test logic 2210 may deactivate a write driver connected with a failure cell from among write drivers included in the driving circuit 123 such that the re-write operation for the failure cell is not performed. In an exemplary embodiment, in the pattern write operation, the built-in-self-test logic 2210 may control the write drivers included in the driving circuit 123 such that a write driver connected with a failure cell from among the write drivers writes failure information in the failure cell.

Figure 24:
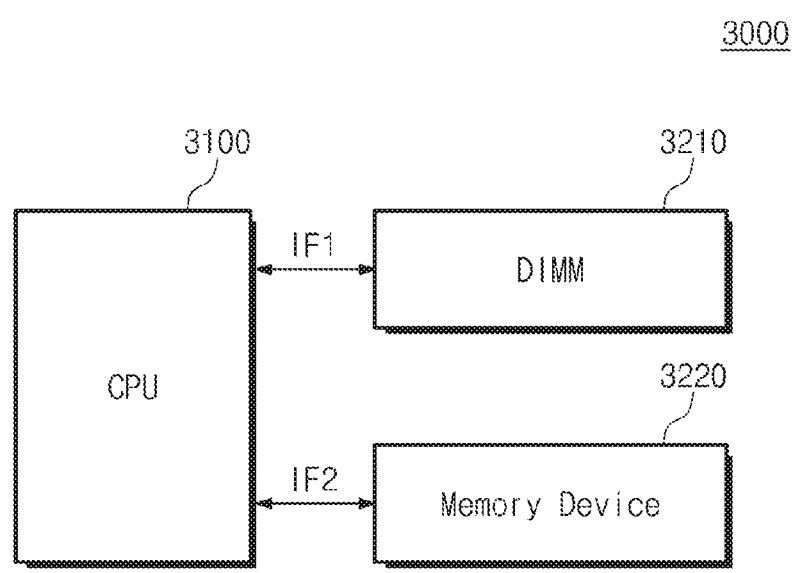
FIG. 24 illustrates a block diagram of a computing system according to embodiments of the inventive concepts.

FIG. 24 illustrates a block diagram of a computing system according to embodiments of the inventive concepts. Referring to FIG. 24, a computing system 3000 may include a central processing unit (CPU) 3100, a memory module (DIMM) 3210, and a memory device 3220. The memory module 3210 may be provided in the form of a dual in-line memory module (DIMM). The memory device 3220 may be one of the memory devices described with reference to FIGS. 1 to 23.

In an exemplary embodiment, the memory module 3210 may be configured to perform a cache function or a buffer function of the central processing unit 3100. In an exemplary embodiment, the memory device 3220 may be used as a nonvolatile memory or storage configured to store data under control of the central processing unit 3100. In an exemplary embodiment, the memory device 3220 may be an MRAM device or a 3D-Xpoint™ memory.

The memory module 3210 may communicate with the central processing unit 3100 through a first interface IF1. The memory device 3220 may communicate with the central processing unit 3100 through a second interface IF2. In an exemplary embodiment, the first and second interfaces IF1 and IF2 may be interfaces of the same type or may be interfaces defined by the same standard. Alternatively, the first and second interfaces IF1 and IF2 may be interfaces of different types. In an exemplary embodiment, the first interface IF1 may be a DDR interface, and the second interface IF2 may be a modified DDR interface (e.g., a DDR-T interface). However, the inventive concepts are not limited thereto.

Figure 25:
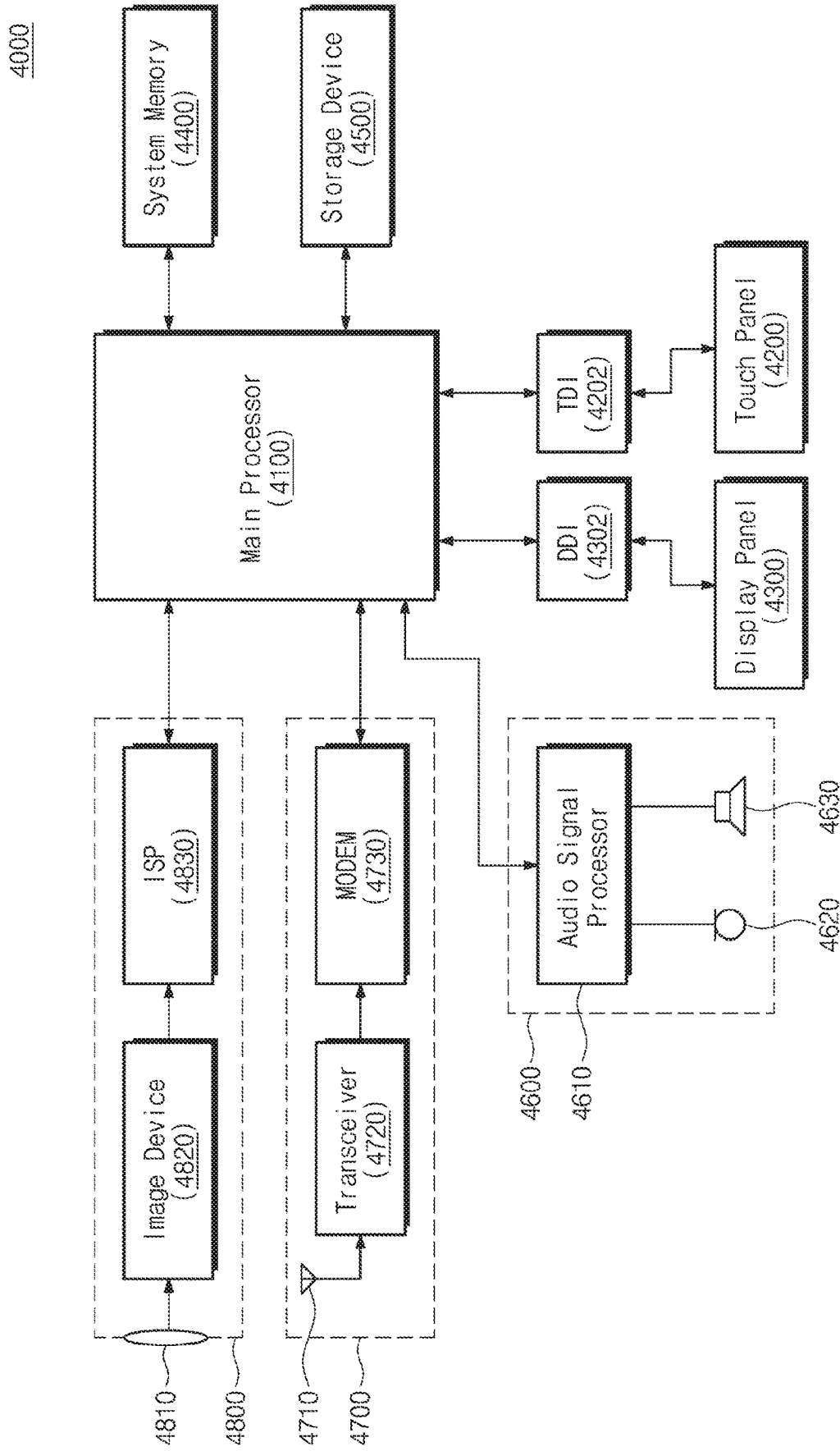
FIG. 25 illustrates a block diagram of an electronic device according to embodiments of the inventive concepts.

FIG. 25 illustrates a block diagram of an electronic device according to embodiments of the inventive concepts. Referring to FIG. 25, an electronic device 4000 may include a main processor 4100, a touch panel 4200, a touch driving integrated (TDI) circuit 4202, a display panel 4300, a display driving integrated (DDI) circuit 4302, a system memory 4400, a storage device 4500, an audio processor 4600, a communication block 4700, and an image processor 4800. In an exemplary embodiment, the electronic device 4000 may be one of various electronic devices such as for example a portable communication terminal, a personal digital assistant (PDA), a portable media player (PMP), a digital camera, a smartphone, a tablet computer, a laptop computer, and a wearable device, or the like.

The main processor 4100 may control overall operations of the electronic device 4000. The main processor 4100 may control/manage operations of the components of the electronic device 4000. The main processor 4100 may process various operations for the purpose of operating the electronic device 4000. The touch panel 4200 may be configured to sense a touch input from a user under control of the touch driving integrated circuit 4202. The display panel 4300 may be configured to display image information under control of the display driving integrated circuit 4302.

The system memory 4400 may store data that are used for an operation of the electronic device 4000. For example, the system memory 4400 may include volatile memory such as for example static random access memory (SRAM), dynamic RAM (DRAM), or synchronous DRAM (SDRAM), and/or nonvolatile memory such as for example phase-change RAM (PRAM), magneto-resistive RAM (MRAM), resistive RAM (ReRAM), or ferroelectric RAM (FRAM). The storage device 4500 may store data regardless of whether a power is supplied. For example, the storage device 4500 may include at least one of various nonvolatile memories such as for example flash memory, PRAM, MRAM, ReRAM, and FRAM. For example, the storage device 4500 may include an embedded memory and/or a removable memory of the electronic device 4000. In an exemplary embodiment, the system memory 4400 or the storage device 4500 may include the memory device described with reference to FIGS. 1 to 24 or a memory device tested based on the operation method described with reference to FIGS. 1 to 24.

The audio processor 4600 may process an audio signal by using an audio signal processor 4610. The audio processor 4600 may receive audio input through a microphone 4620 or may provide audio output through a speaker 4630. The communication block 4700 may exchange signals with an external device/system through an antenna 4710. A transceiver 4720 and a modulator/demodulator (MODEM) 4730 of the communication block 4700 may process signals exchanged with the external device/system in compliance with at least one of various wireless communication protocols such as long term evolution (LTE™), worldwide interoperability for microwave access (WiMax), global system for mobile communication (GSM), code division multiple access (CDMA), Bluetooth, near field communication (NFC), wireless fidelity (Wi-Fi), and radio frequency identification (RFID) or the like. The image processor 4800 may receive light through a lens 4810. An image device 4820 and an image signal processor (ISP) 4830 included in the image processor 4800 may generate image information about an external object, based on a received light.

Figure 26:
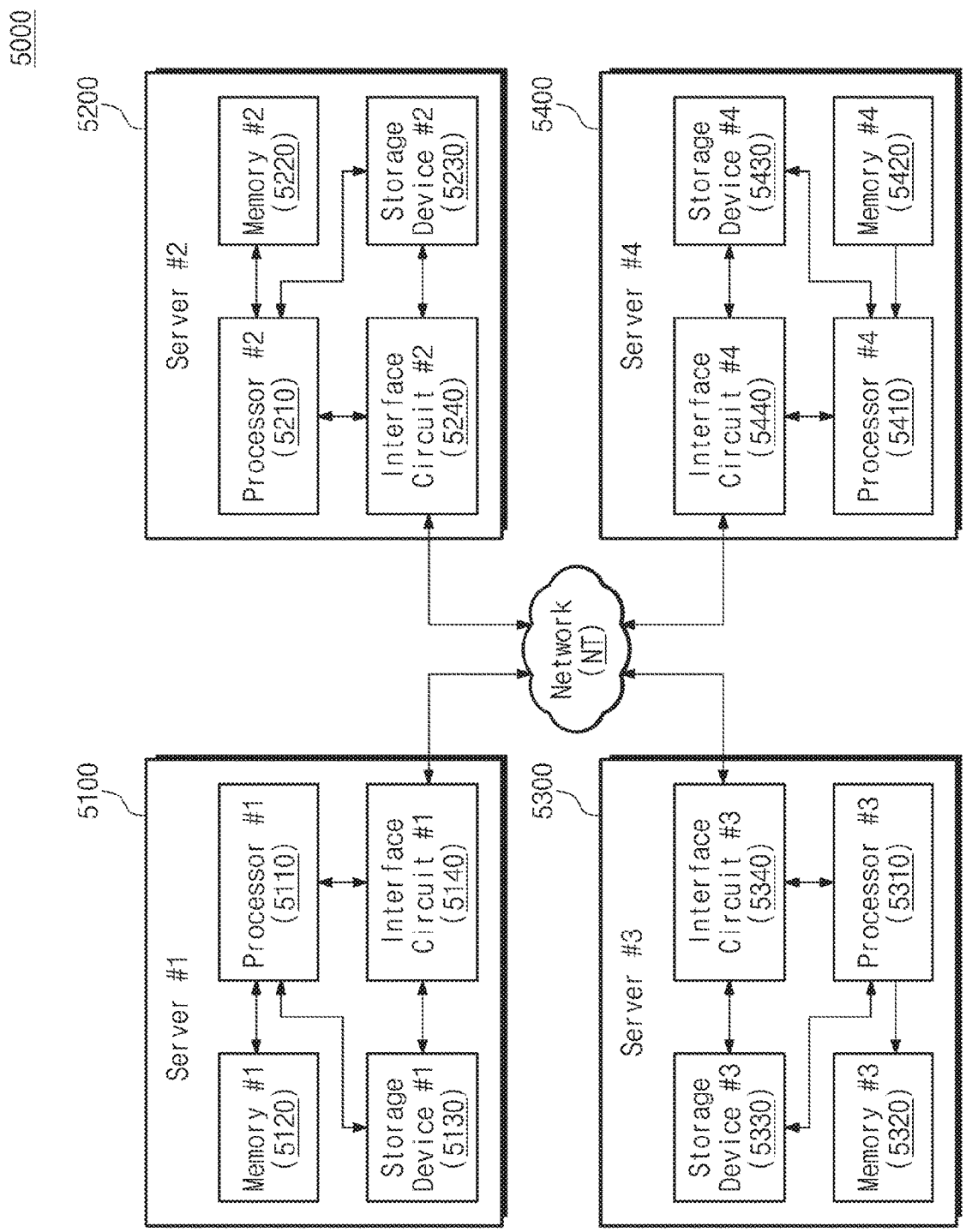
FIG. 26 illustrates a block diagram of a data center to which a storage system according to embodiments of the inventive concepts may be applied.

FIG. 26 illustrates a block diagram of a data center to which a storage system according to embodiments of the inventive concepts may be applied. Referring to FIG. 26, a data center 5000 may include a plurality of computing nodes (or servers) 5100 to 5400. The plurality of computing nodes 5100 to 5400 may communicate with each other over a network NT. In an exemplary embodiment, the network NT may be a storage dedicated network such as a storage area network (SAN) or may be an Internet network such as TCP/IP. In an exemplary embodiment, the network NT may include at least one of various communication protocols such as Fibre channel$^{SM}$, iSCSI protocol, FCoE, NAS, and NVMe-oF.

The plurality of computing nodes 5100 to 5400 may respectively include processors 5110, 5210, 5310, and 5410, memories 5120, 5220, 5320, and 5420, storage devices 5130, 5230, 5330, and 5430, and interface circuits 5140, 5240, 5340, and 5440.

For example, the first computing node 5100 may include the first processor 5110, the first memory 5120, the first storage device 5130, and the first interface circuit 5140. In an exemplary embodiment, the first processor 5110 may be implemented with a single core or a multi-core. The first memory 5120 may include memory such as for example DRAM, SDRAM, SRAM, 3D XPoint™ memory, MRAM, PRAM, FeRAM, or ReRAM. The first memory 5120 may be used as a system memory, a working memory, or a buffer memory of the first computing node 5100. The first storage device 5130 may be a high-capacity storage medium such as a hard disk drive (HDD) or a solid state drive (SSD). The first interface circuit 5140 may be a network interface controller (NIC) configured to support communication over the network NT.

In an exemplary embodiment, the first processor 5110 of the first computing node 5100 may be configured to access the first memory 5120 based on a given memory interface. Alternatively, in an embodiment of a shared memory architecture, the first processor 5110 of the first computing node 5100 may be configured to access the memories 5220, 5320, and 5420 of the remaining computing nodes 5200, 5300, and 5400 over the network NT. The interface circuit 5140 may include a network switch (not illustrated) configured to control or support an access to a shared memory (i.e., memories of any other computing nodes).

In an exemplary embodiment, the first processor 5110 of the first computing node 5100 may be configured to access the first storage device 5130 based on a given storage interface. Alternatively, the first processor 5110 of the first computing node 5100 may be configured to access the storage devices 5230, 5330, and 5430 of the remaining computing nodes 5200, 5300, and 5400 over the network NT. The interface circuit 5140 may include a network switch (not illustrated) configured to control or support an access to storage devices of any other computing nodes. In an exemplary embodiment, the storage devices 5130 to 5430 respectively included in the plurality of computing nodes 5100 to 5140 may constitute one RAID volume. Operations of the second to fourth computing nodes 5200 to 5400 may be similar to the operation of the first computing node 5100 described above, and thus, additional description will be omitted to avoid redundancy.

In an exemplary embodiment, various applications may be executed at the data center 5000. The applications may be configured to execute an instruction for data movement or copy between the computing nodes 5100 to 5400 or may be configured to execute instructions for combining, processing, or reproducing a variety of information present on the computing nodes 5100 to 5400. In an exemplary embodiment, the applications may be executed by one of the plurality of computing nodes 5100 to 5400 included in the data center 5000, or the applications may be distributed and executed between the plurality of computing nodes 5100 to 5400.

In an exemplary embodiment, the data center 5000 may be used for high-performance computing (HPC) (e.g., finance, petroleum, materials science, meteorological prediction), an enterprise application (e.g., scale out database), a big data application (e.g., NoSQL database or in-memory replication).

In an exemplary embodiment, at least one of the plurality of computing nodes 5100 to 5400 may be an application server. The application server may be configured to execute an application configured to perform various operations at the data center 5000. At least one of the plurality of computing nodes 5100 to 5400 may be a storage server. The storage server may be configured to store data that are generated or managed at the data center 5000.

In an exemplary embodiment, the plurality of computing nodes 5100 to 5400 included in the data center 5000 or portions thereof may be present at the same site or at sites physically separated from each other and may communicate with each other over the wireless communication or wired communication based network NT. In an exemplary embodiment, the plurality of computing nodes 5100 to 5400 included in the data center 5000 may be implemented by the same memory technology or may be implemented by different memory technologies.

Although not illustrated in drawing, at least a part of the plurality of computing nodes 5100 to 5400 of the data center 5000 may communicate with an external client node (not illustrated) over the network NT or over any other communication interface (not illustrated). At least a part of the plurality of computing nodes 5100 to 5400 may automatically process a request (e.g., data store or data transfer) depending on a request of the external client node or may process the request at any other computing node.

In an exemplary embodiment, the number of computing nodes 5100 to 5400 included in the data center 5000 is exemplary, and the inventive concepts are not limited thereto. Also, in each computing node, the number of processors, the number of memories, and the number of storage devices are exemplary, and the inventive concepts are not limited to the features as shown in FIG. 26.

In an exemplary embodiment, at least one of the memories 5120 to 5420, the storage devices 5130 to 5430, or system memories included in the processors 5110 to 5410, which are respectively included in the plurality of computing nodes 5100 to 5400, may be the memory device described with reference to FIGS. 1 to 24 or may be a memory device that includes BIST logic configured to perform the test operations described with reference to FIGS. 1 to 24 or is verified through the test operations described with reference to FIGS. 1 to 24. Alternatively, each or at least one of the plurality of computing nodes 5100 to 5400 may include a test device or BIST logic configured to test at least one of the memories 5120 to 5420, the storage devices 5130 to 5430, or system memories included in the processors 5110 to 5410, which are respectively included in the plurality of computing nodes 5100 to 5400, based on the operation methods described with reference to FIGS. 1 to 24.

According to embodiments of the inventive concept, a write failure for a memory device may be detected by iteratively writing a specific pattern in the memory device. In this case, the specific pattern is generated such that a write operation for a failure cell(s) determined as a write failure in a previous pattern write operation is skipped. As such, because the write operation for memory cells determined as a failure cell at least once or more, or as much as the reference number of times or more, in the iteration of the pattern write operation is skipped, the failure cell itself may maintain information about a failure cell. That is, even though a write failure does not simultaneously occur at a plurality of memory cells in one pattern write operation, cells having a high probability that a write failure occurs are detected through a plurality of pattern write operations. Accordingly, a test method for a memory device having improved reliability, an operation method of a test device testing a memory device, and a memory device including a self-test function are provided.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. A test method for a memory device including a plurality of memory cells, the method comprising:
generating a first test pattern;
performing a first pattern write operation of writing the first test pattern in the plurality of memory cells;
reading first data from the plurality of memory cells in which the first test pattern was written;
generating a second test pattern based on the first data; and
performing a second pattern write operation of writing the second test pattern in the plurality of memory cells,
wherein the second test pattern is generated such that failure information is written in failure cells from among the plurality of memory cells in which a write failure occurs.

2. The method of claim 1, wherein the plurality of memory cells are connected with a same word line.

3. The method of claim 1, wherein each of the plurality of memory cells comprises a variable resistance element including a magnetic tunnel junction (MTJ) having a resistance value that varies depending on a direction of current flowing through the variable resistance element.

4. The method of claim 1, wherein the first test pattern is a default test pattern, and the performing of the second pattern write operation comprises:
performing a back-write operation of writing a first inversion pattern in the plurality of memory cells, the first inversion pattern is an inverted version of the default test pattern; and
performing a re-write operation of writing the second test pattern in the plurality of memory cells in which the back-write operation was performed.

5. The method of claim 4, wherein the failure information is written in the failure cells of the plurality of memory cells during the back-write operation or the re-write operation.

6. The method of claim 1, wherein the first test pattern includes data in which all bit values are a first value, and
wherein the second test pattern includes data in which a bit value corresponding to each of the failure cells is a second value different from the first value, and remaining bit values corresponding to memory cells from among the plurality of memory cells other than the failure cells are the first value.

7. The method of claim 1, wherein an iteration of the generating of the second test pattern and the performing of the second pattern write operation is performed as much as a given number of times, and
during the iteration the second test pattern is generated based on a result of a previous pattern write operation such that the failure information is written in the failure cells.

8. The method of claim 7, wherein the failure cells are memory cells from among the plurality of memory cells at which a write failure occurs at least "n" times in the iteration, wherein n is a natural number of 2 or more.

9. The method of claim 7, wherein the failure cells are memory cells from among the plurality of memory cells at which a write failure occurs successively at least "n" times in the iteration, wherein n is a natural number of 2 or more.

10. The method of claim 7, further comprising:
after the iteration of the generating of the second test pattern and the performing of the second pattern write operation is performed as much as the given number of times,
reading final data from the plurality of memory cells;
determining a number of the failure cells of the plurality of memory cells based on the final data and comparing the number of the failure cells with a reference value; and
when the number of the failure cells exceeds the reference value, performing a repair operation or a screen operation on the memory device.

11. The method of claim 10, wherein the reference value corresponds to an error correction capability of an error correction code (ECC) engine included in the memory device or a memory controller configured to control the memory device.

12. The method of claim 11, wherein a number of the plurality of memory cells corresponds to an error correction unit of the ECC engine.

13. An operation method of a test device configured to test a memory device including a plurality of memory cells, the method comprising:
generating a first test pattern and performing a first pattern write operation of writing the first test pattern in the plurality of memory cells;
reading first data from the plurality of memory cells;
generating a second test pattern based on the first data and performing a second pattern write operation of writing the second test pattern in the plurality of memory cells;
reading second data from the plurality of memory cells; and
generating a third test pattern based on the second data and performing a third pattern write operation of writing the third test pattern in the plurality of memory cells,
wherein the second test pattern is generated such that failure information is written during the second pattern write operation in at least one first failure cell from among the plurality of memory cells at which a write failure occurs during the first pattern write operation, and wherein the third test pattern is generated such that the failure information is written during the third pattern write operation in the at least one first failure cell, and in at least one second failure cell from among the plurality of memory cells at which a write failure occurs during the second pattern write operation.

14. The method of claim 13, wherein the first test pattern is generated based on a test type associated with the memory device.

15. The method of claim 14, wherein the test type comprises a first test type for testing whether each of the plurality of memory cells normally switches from a first state corresponding to a first bit value to a second state corresponding to a second bit value, and a second test type for testing whether each of the plurality of memory cells normally switches from the second state to the first state, during a write operation.

16. The method of claim 15, wherein for the first test type
all bit values of the first test pattern are the second bit value;
a bit value corresponding to the at least one first failure cell from among bit values of the second test pattern is the first bit value, and remaining bit values of the second test pattern other than the bit value corresponding to the at least one first failure cell are the second bit value; and
bit values respectively corresponding to the at least one first failure cell and the at least one second failure cell from among bit values of the third test pattern are the first bit value, and remaining bit values of the third test pattern other than the bit values corresponding to the at least one first failure cell and the at least one second failure cell are the second bit value, and
wherein for the second test type
all the bit values of the first test pattern are the first bit value;
the bit value corresponding to the at least one first failure cell from among the bit values of the second test pattern is the second bit value, and the remaining bit values of the second test pattern other than the bit value corresponding to the at least one first failure cell are the first bit value; and
the bit values respectively corresponding to the at least one first failure cell and the at least one second failure cell from among the bit values of the third test pattern are the second bit value, and the remaining bit values of the third test pattern other than the bit values corresponding to the at least one first failure cell and the at least one second failure cell are the first bit value.

17. A memory device including a self-test function, comprising:
a memory cell array including a plurality of memory cells;
a driving circuit configured to perform a write operation and a read operation on the plurality of memory cells; and
built-in-self-test (BIST) logic configured to perform a self-test under control of an external device,
wherein during the self-test the BIST logic is configured to iteratively perform a pattern write operation on the plurality of memory cells, and
for each iteration of the pattern write operation the BIST logic is configured to control the driving circuit to write failure information in failure cells from among the plurality of memory cells at which a write failure occurs.

18. The memory device of claim 17, wherein each of the plurality of memory cells comprises:
a selection transistor configured to operate in response to a voltage on a word line, wherein one end of the selection transistor is connected with a source line; and
a variable resistance element connected between the selection transistor and a bit line, wherein a resistance value of the variable resistance element is variable depending on a direction of current flowing through the variable resistance element.

19. The memory device of claim 17, wherein for each iteration of the pattern write operation the BIST logic is configured to generate a test pattern and to control the driving circuit to write the test pattern in the plurality of memory cells,
wherein the test pattern includes the failure information that is written in the failure cells.

20. The memory device of claim 17, wherein the driving circuit comprises write drivers configured to control bit lines and source lines connected with the plurality of memory cells, and
for each iteration of the pattern write operation the BIST logic is further configured to deactivate write drivers from among the write drivers corresponding to the failure cells.

* * * * *